United States Patent
Hölzl et al.

(10) Patent No.: US 10,658,497 B2
(45) Date of Patent: May 19, 2020

(54) METHOD FOR MANUFACTURING SEMICONDUCTOR DEVICES WITH SUPERJUNCTION STRUCTURES

(71) Applicant: Infineon Technologies Austria AG, Villach (AT)

(72) Inventors: Daniel Hölzl, Unterhaching (DE); Henning Kraack, Villach (AT); Gabor Mezoesi, Villach (AT); Hans-Joachim Schulze, Taufkirchen (DE); Waqas Mumtaz Syed, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/054,236

(22) Filed: Aug. 3, 2018

(65) Prior Publication Data

US 2019/0043971 A1 Feb. 7, 2019

(30) Foreign Application Priority Data

Aug. 4, 2017 (DE) .................. 10 2017 117 753

(51) Int. Cl.

| | |
|---|---|
| *H01L 29/739* | (2006.01) |
| *H01L 29/66* | (2006.01) |
| *H01L 29/06* | (2006.01) |
| *C30B 31/22* | (2006.01) |
| *H01L 21/322* | (2006.01) |
| *C30B 29/06* | (2006.01) |
| *H01L 21/306* | (2006.01) |
| *H01L 29/08* | (2006.01) |

(52) U.S. Cl.
CPC .......... *H01L 29/7395* (2013.01); *C30B 29/06* (2013.01); *C30B 31/22* (2013.01); *H01L 21/30604* (2013.01); *H01L 21/3225* (2013.01); *H01L 29/0634* (2013.01); *H01L 29/0878* (2013.01); *H01L 29/66333* (2013.01); *H01L 29/66712* (2013.01)

(58) Field of Classification Search
CPC ............ H01L 29/7395; H01L 29/0634; H01L 29/0878; H01L 29/66333; H01L 29/66712; H01L 21/30604; H01L 21/3225; C30B 29/06; C30B 31/22
USPC ....................................... 257/341
See application file for complete search history.

(56) References Cited

U.S. PATENT DOCUMENTS

| | | | |
|---|---|---|---|
| 2005/0156235 A1 | 7/2005 | Fujihira | |
| 2012/0299094 A1* | 11/2012 | Lee ................. | H01L 29/0688 257/341 |

(Continued)

FOREIGN PATENT DOCUMENTS

| | | |
|---|---|---|
| DE | 19637182 A1 | 3/1998 |
| DE | 102008027521 A1 | 12/2009 |
| DE | 102015121890 A1 | 6/2017 |

*Primary Examiner* — Tu-Tu V Ho
(74) *Attorney, Agent, or Firm* — Murphy, Bilak & Homiller, PLLC

(57) ABSTRACT

A method for forming semiconductor device includes providing a semiconductor substrate having an initial surface oxygen concentration in a surface region of less than $6 \times 10^{17}$ $cm^{-3}$, forming an epitaxial layer on a first side of the semiconductor substrate, and implanting dopants into the epitaxial layer. An optional thermal anneal is carried out prior to forming the epitaxial layer and/or a thermal treatment is carried out after implanting dopants.

25 Claims, 13 Drawing Sheets

(56) References Cited

U.S. PATENT DOCUMENTS

2014/0231910 A1* 8/2014 Willmeroth ......... H01L 29/0634
257/339
2017/0018457 A1* 1/2017 Schulze ............ H01L 21/76841

* cited by examiner

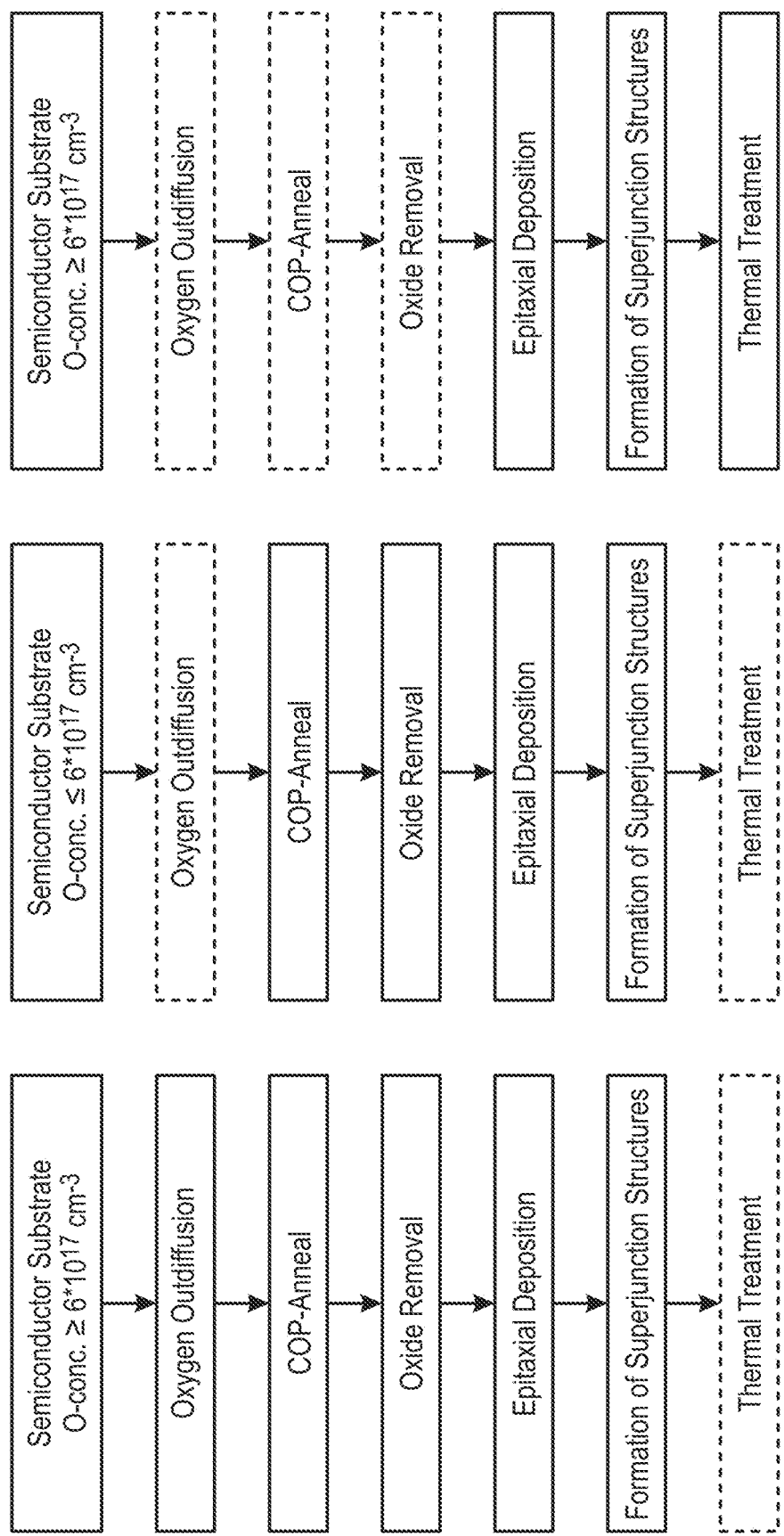

US 10,658,497 B2

METHOD FOR MANUFACTURING SEMICONDUCTOR DEVICES WITH SUPERJUNCTION STRUCTURES

TECHNICAL FIELD

Embodiments described herein relate to methods for manufacturing semiconductor devices with superjunction structures. Further embodiments pertain to semiconductor devices having superjunction structures.

BACKGROUND

For manufacturing of semiconductor devices, long oven processes are employed at high temperatures to diffuse dopants, which are implanted into the semiconductor material, in the semiconductor lattice of the semiconductor material. The dopants create p- and n-doped regions needed for device operability. The mobility of charge carriers can be affected by intrinsic impurities and defects of the semiconductor material. For example, silicon-based semiconductor materials may contain oxygen. When the oxygen concentration is too high, oxygen precipitates. Furthermore, the semiconductor material may contain so-called COPs (Crystal Originated Particles) which additionally influence the mobility of charge carriers and can thus worsen the performance of the final semiconductor device.

So-called FZ-semiconductor material manufactured using a floating zone process has a low oxygen concentration. However, FZ-semiconductor material is expensive. The more cheap CZ-semiconductor material, manufactured using the so-called Czochralski process, has a comparably high oxygen concentration due to the dissolution of material of the crucible used for melting the semiconductor material. Due to cost reasons, CZ-semiconductor material is typically the material of choice.

Attempts have been made to reduce the influence of oxygen precipitates and COPs on the charge carrier mobility in CZ-based semiconductor materials. However, there is need for further improvement.

SUMMARY

According to an embodiment, a method for manufacturing semiconductor devices includes providing a semiconductor substrate having a surface region at a first side of the semiconductor substrate, the surface region having an oxygen concentration of less than $6 \times 10^{17}$ cm$^{-3}$; forming an epitaxial layer on the first side of the semiconductor substrate; and forming a plurality of superjunction semiconductor device structures in the epitaxial layer.

According to an embodiment, a method for manufacturing semiconductor devices includes providing a semiconductor substrate having an initial oxygen bulk concentration of at least $6 \times 10^{17}$ cm$^{-3}$, the semiconductor substrate having a first side; subjecting the semiconductor substrate to a thermal oxygen-out-diffusion anneal in an ambient containing at least one of oxygen, argon, hydrogen and nitrogen at a temperature sufficient to reduce the oxygen concentration in a surface region of the semiconductor substrate arranged at the first side of the semiconductor substrate; subsequently to the thermal oxygen-out-diffusion anneal, forming an epitaxial layer on the first side of the semiconductor substrate; and forming a plurality of superjunction semiconductor device structures in the epitaxial layer.

According to an embodiment, a method for manufacturing semiconductor devices includes providing a semiconductor substrate having an initial oxygen concentration of at least $6 \times 10^{17}$ cm$^{-3}$, the semiconductor substrate having a first side; forming an epitaxial layer on the first side of the semiconductor substrate; implanting dopants for forming a superjunction semiconductor device structure in the epitaxial layer; and subsequently to implanting, subjecting the epitaxial layer to a thermal treatment at a temperature of at least 1050° C., particularly of at least 1100° C., for a sufficient time to diffuse the dopants in the epitaxial layer According to an embodiment, a semiconductor device includes a semiconductor substrate having a bulk oxygen concentration of less than $6 \times 10^{17}$ cm$^{-3}$, and an epitaxial layer on the first side of the semiconductor substrate, wherein the epitaxial layer and the semiconductor substrate have a common interface. A superjunction semiconductor device structure is formed in the epitaxial layer.

According to an embodiment, a semiconductor device includes a semiconductor substrate having a bulk oxygen concentration of at least $6 \times 10^{17}$ cm$^{-3}$, and an epitaxial layer on the first side of the semiconductor substrate, wherein the epitaxial layer and the semiconductor substrate have a common interface. A superjunction semiconductor device structure is formed in the epitaxial layer. An interface region is formed which extends from the common interface into the semiconductor substrate to a depth of at least 10 μm, wherein the mean oxygen concentration of the interface region is lower than the bulk oxygen concentration of the semiconductor substrate.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 6A to 6C illustrates various embodiments of a method for manufacturing semiconductor devices.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical", "under", "below", "lower", "over", "upper" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

In this specification, a second surface of a semiconductor substrate or of a semiconductor body is considered to be formed by the lower or back-side surface while a first surface is considered to be formed by the upper, front or main surface of the semiconductor substrate and of the semiconductor body, respectively. The terms "above" and "below" as used in this specification therefore describe a relative location of a structural feature to another structural feature with consideration of this orientation.

The terms "electrical connection" and "electrically connected" describes an ohmic connection between two elements.

Figure 1A:
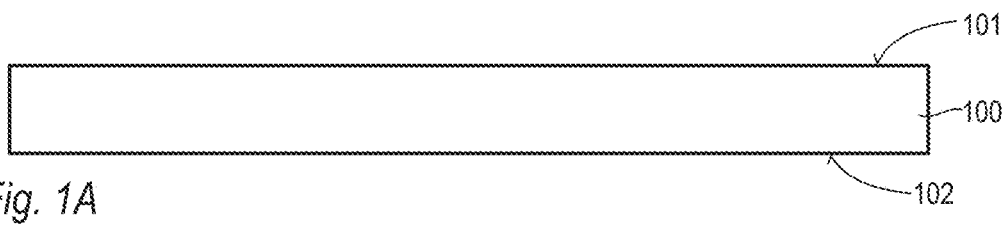
FIGS. 1A to 1D illustrate processes of a method for manufacturing semiconductor devices according to an embodiment.

FIGS. 1A to 1D illustrate processes of a method according to an embodiment. A semiconductor substrate 100 having an initial oxygen bulk concentration of at least $6\times10^{17}$ cm$^{-3}$ is provided. As illustrated in FIG. 1A, the semiconductor substrate 100 includes a first side 101 and a second side 102 opposite the first side 101. Typically, the semiconductor substrate 100 is a CZ-semiconductor material. The initial oxygen bulk concentration of the semiconductor substrate 100 can be, according to embodiments, at least $7\times10^{17}$ cm$^{-3}$, particularly at least $8\times10^{17}$ cm$^{-3}$.

When referring to the oxygen concentration in the semiconductor substrate or in other semiconductor materials, the oxygen concentration as determined by SIMS (secondary ion mass spectroscopy) is meant. SIMS uses a focused ion beam directed onto the surface of the specimen to generate secondary ions which are ejected from the specimen and collected and analysed using a mass spectrometer.

The semiconductor substrate 100 can be made of any semiconductor material suitable for manufacturing semiconductor components. Typical examples of such material include, without being limited thereto, elementary semiconductor materials such as silicon (Si) and binary III-V semiconductor materials such as gallium nitride (GaN). For power semiconductor applications currently mainly Si, SiC, GaAs and GaN materials are used. In the present embodiment, the semiconductor substrate is Si.

According to an embodiment, the semiconductor substrate 100 is subjected to a thermal anneal. The thermal anneal may include at least one of a thermal oxygen-out-diffusion anneal and a thermal oxidation anneal. Both anneals are adapted to bring about different improvements of the semiconductor substrate 100. The oxygen-out-diffusion is mainly designed to reduce the oxygen concentration, at least in a surface region of the semiconductor substrate 100. The thermal oxidation anneal aims for at least partially removing COPs in the semiconductor substrate 100.

According to an embodiment, the thermal anneal includes at least the thermal oxidation anneal. The oxygen-out-diffusion anneal can optionally be carried out when the initial bulk oxygen concentration is too high, such as higher than $6\times10^{17}$ cm$^{-3}$. The oxygen-out-diffusion anneal can also be carried out if the oxygen concentration is below $6\times10^{17}$ cm$^{-3}$, since any reduction of the oxygen concentration, at least in a surface region, is also beneficial for the thermal oxidation anneal to remove COPs. The semiconductor substrate 100 having initial oxygen bulk concentration higher than $6\times10^{17}$ cm$^{-3}$ may also be referred to as raw semiconductor substrate as it is processed by the oxygen-out-diffusion anneal to reduce the oxygen concentration at least in surface regions.

According to an embodiment, the oxygen-out-diffusion anneal is carried out prior to the thermal oxidation anneal. The thermal anneal can therefore include two anneals, the oxygen-out-diffusion anneal followed by the thermal oxidation anneal. Between these two anneals, the semiconductor substrate 100 may be cooled down to an elevated temperature before heated again. Typically, the atmosphere to which the semiconductor substrate 100 is subjected is changed between the two anneals.

Figure 1B:
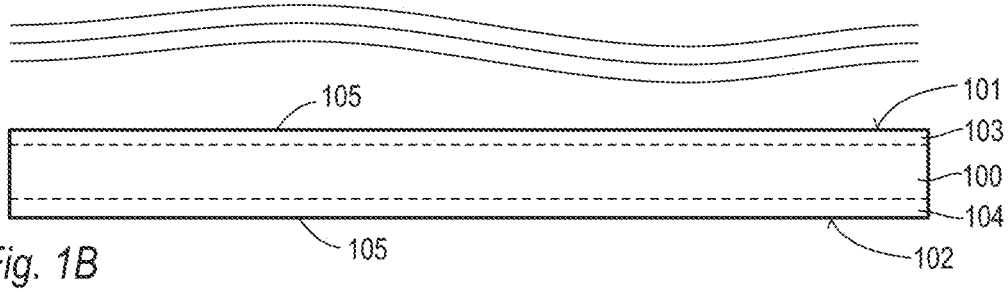

According to an embodiment, the oxygen-out-diffusion anneal is carried out in an ambient containing at least one of oxygen, argon, hydrogen and nitrogen at a temperature sufficient to reduce the oxygen concentration in a surface region 103 of the semiconductor substrate 100. The surface region 103 may be referred to as first surface region 103 and is located at the first side 101 of the semiconductor substrate 100. When the second side 102 of the semiconductor substrate 100 is not covered, the oxygen concentration is also reduced in a surface region 104, which may be referred to as second surface region 104, at the second side 102 of the semiconductor substrate 100. This is illustrated in FIG. 1B. The first and the second surface regions 103, 104, respectively, are typically located at and extending to the respective first and second side 101, 102. The oxygen concentration in the first and second surface regions 103, 104, respectively, reduces from the initial oxygen bulk concentration within the semiconductor substrate 100 to a surface oxygen concentration at the first and the second side 101, 102, respectively. The surface oxygen concentration can be, for example, less than $6\times10^{17}$ cm$^{-3}$, particularly less than $5\times10^{17}$ cm$^{-3}$, and more particularly less than $4\times10^{17}$ cm$^{-3}$.

According to an embodiment, the oxygen-out-diffusion anneal is carried out in an inert atmosphere. According to an embodiment, a protective oxide layer, such as a CVD-oxide layer, is formed on the surface of the semiconductor substrate 100 prior to subjecting the semiconductor substrate 100 to an inert atmosphere. It is also possible to subject the semiconductor substrate to an ambient which is partially oxidative.

Figure 7:
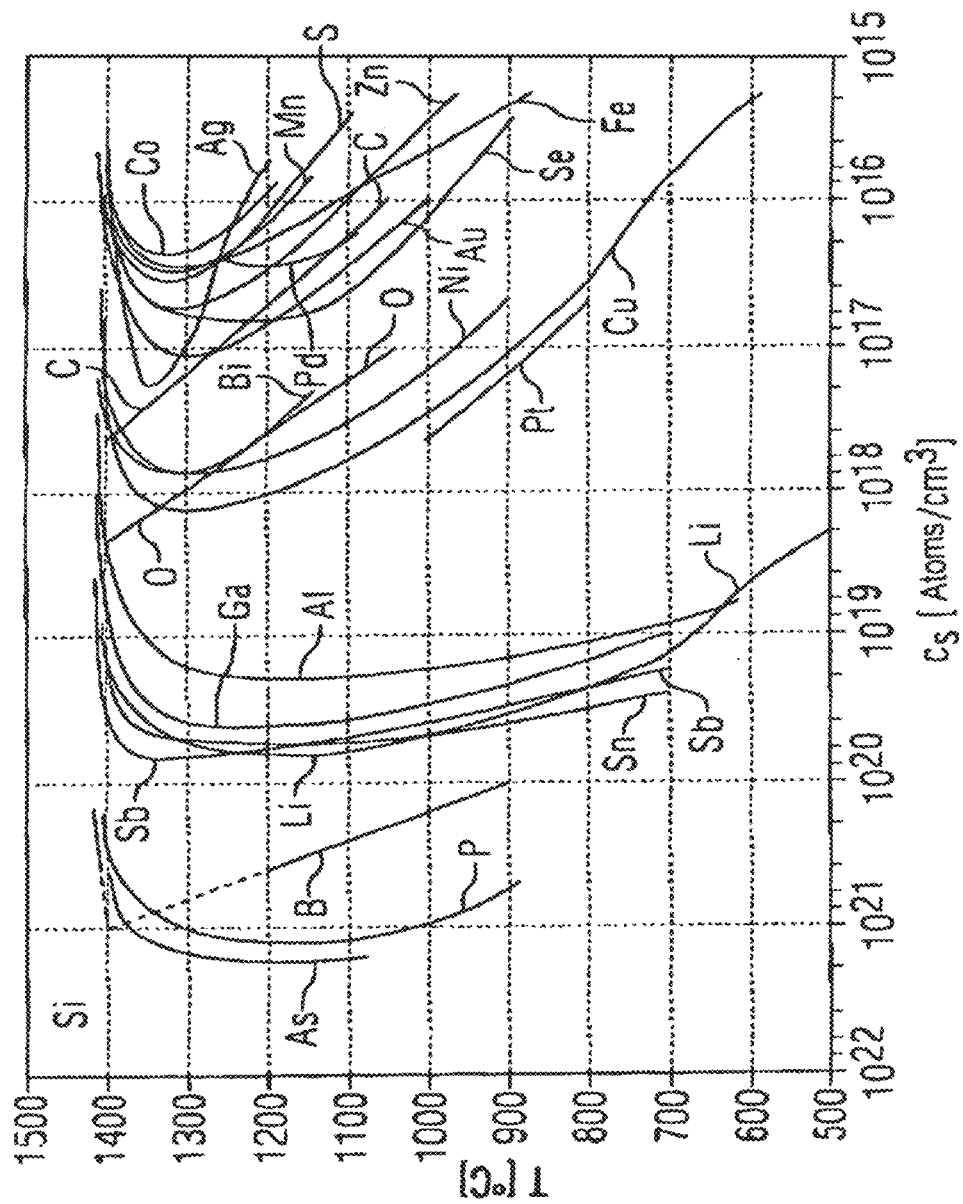
FIG. 7 illustrates the temperature-dependency of the solid solubility of various elements in silicon.

According to an embodiment, the temperature of the oxygen-out-diffusion anneal is selected in view of the target oxygen concentration. The solid solubility of oxygen is temperature-dependent and typically increases with the temperature as illustrated in FIG. 7. The maximum temperature of the oxygen-out-diffusion anneal may be set to give a solid solubility for oxygen below the target oxygen concentration. With reference to FIG. 7, if, for example, the target oxygen concentration is about $4 \times 10^{17}$ cm$^{-3}$, the maximum temperature may be set to be lower than 1200° C., for example lower than 1150° C., or lower than 1100° C.

On the other hand, the maximum temperature is typically selected to be sufficiently high to improve oxygen diffusion since the mobility of oxygen increases with the temperature.

The temperature of the oxygen-out-diffusion anneal can also be, according to embodiments, less than 1100° C., particularly less than 1050° C. In further embodiments, the temperature of the oxygen-out-diffusion anneal can be at least 1000° C. The oxygen-out-diffusion anneal can be carried out, according to embodiments, using a temperature profile with a heating-up region, a maximum temperature region, and a cooling-down region. The heating-up region can include heating at constant rate or at varying heating rates. The maximum temperature may be kept constant for a given time during the maximum temperature region, before cooling-down. Since out-diffusion of oxygen is temperature-dependent, out-diffusion already takes place at temperatures below the maximum temperature. The effective duration of the oxygen-out-diffusion anneal may therefore be longer than the duration of the maximum temperature region.

Different to the oxygen-out-diffusion anneal, the thermal oxidation anneal aims at reducing COPs. According to an embodiment, the thermal oxidation anneal is carried out in an ambient containing water-vapour at a temperature between about 1000° C. and about 1300° C., particularly between about 1050° C. and about 1200° C., and more particularly between about 1100° C. and about 1180° C. The ambient is an oxidative ambient. Water-vapour improves formation of an oxide layer to effectively generate silico self-interstitials which can migrate to and fill the COPs. Oxidation in the presence of water-vapour may also be referred to as wet oxidation.

During the thermal oxidation anneal, typically an oxide layer 105 is formed on exposed surfaces of the semiconductor substrate 100. This oxide layer 105 is subsequently removed.

Figure 1C:
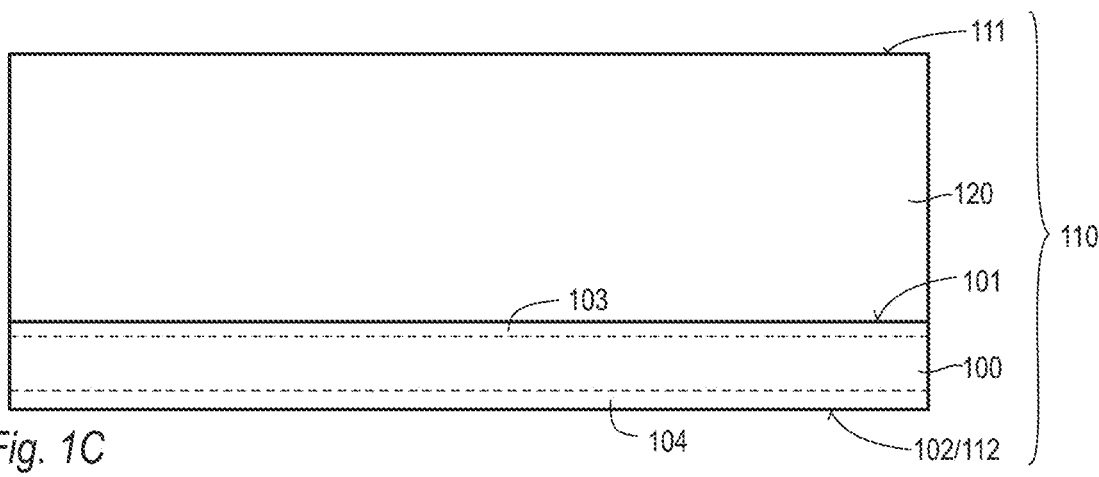

Subsequently to the thermal anneal, which can include the thermal oxidation anneal and/or the oxygen-out-diffusion anneal, an epitaxial layer 120 is formed on the first side 101 of the semiconductor substrate 100 as illustrated in FIG. 1C. The epitaxial layer 120 forms together with the semiconductor substrate 100 a semiconductor body 110 having a first side 111 and a second side 112 opposite the first side 111. The second side 112 of the semiconductor body 110 may be formed by the second side 102 of the semiconductor substrate 100.

The material of the epitaxial layer 120 can be the same as the material of the semiconductor substrate 100. For example, the epitaxial layer 120 can be made of Si. It would also be possible to grow SIC as epitaxial layer 120.

The semiconductor substrate 100 may optionally partially or completely be removed at later process stages. In this case, the second side 112 of the semiconductor body 110 is formed by a processed second side of the semiconductor substrate 100, or in case of a complete removal of the semiconductor substrate 100, by an exposed side of the epitaxial layer 120. The processed second side of the semiconductor substrate 100 describes a side that has been subjected to further processes such as etching or grinding to reduce the thickness of the semiconductor substrate 100.

Figure 1D:
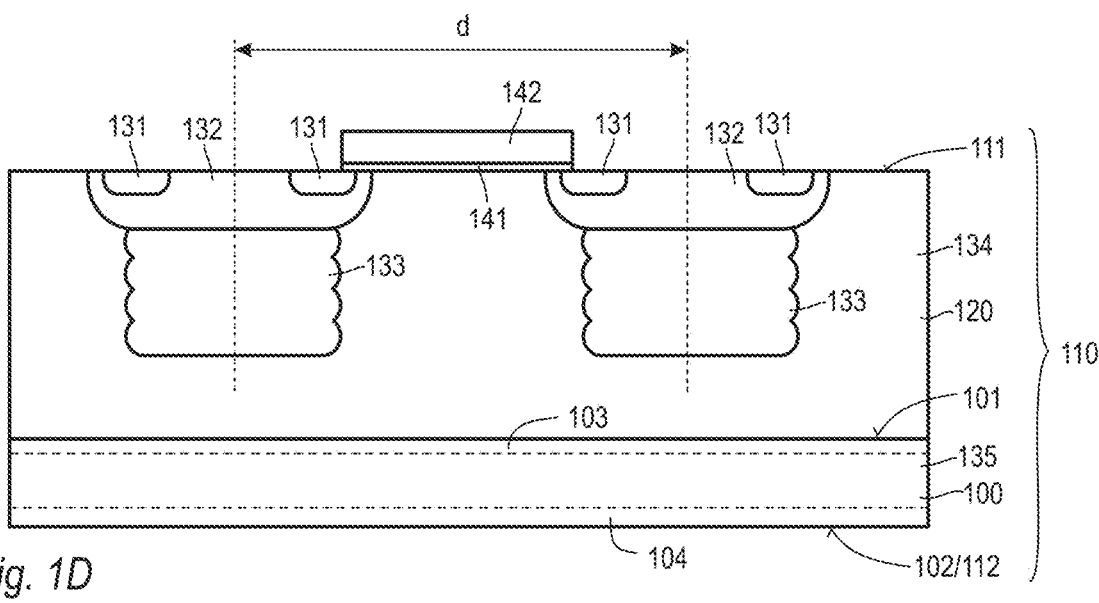

In further processes, as exemplarily illustrated in FIG. 1D, a plurality of superjunction semiconductor device structures 133, 134 may be formed in the epitaxial layer 120. The superjunction semiconductor device structures 133, 134 can form part of active structures such as field effect transistors as exemplarily illustrated in FIG. 1D. A plurality of field effect transistor cells may be formed in the semiconductor body 110. Each field effect transistor cell may include a source region 131 of a second conductivity type, a body region 132 of a first conductivity type, and a superjunction semiconductor device structure 133, 134.

In the embodiments illustrated herein, the first conductivity type is p-type while the second conductivity type is n-type. It is, however, also possible that the first conductivity type is n-type and the second conductivity type is p-type.

The epitaxial layer 120 may be formed to be of the second conductivity type. The columns 133, in the present embodiment p-doped columns 133, extend from the lower end of the body region 132 into the epitaxial layer 120 of the semiconductor body 110. The columns 133 form together with those parts of the n-doped epitaxial layer 120, which are arranged between adjacent columns 133, the superjunction semiconductor device structures. These parts of the n-doped epitaxial layer 120 may also be referred to as n-doped columns to distinguish them from other regions of the epitaxial layer 120 which may form the so-called drift region 134. The n-doped columns arranged between adjacent p-doped columns 133 may have a higher doping concentration than the drift region 134. The drift region 134, which includes the n-columns, may therefore have regions with different doping concentration.

In plan view onto the first side 111 of the semiconductor body 110, each of the p-columns 133 may be completely surrounded by the n-doped semiconductor material of the epitaxial layer 120. The n-columns of the drift region 134 form together with the adjacent p-columns pn-superjunctions which mainly runs vertically relative to the first side 111 of the semiconductor body 110. The lower end of the p-columns 133 may extend close to the semiconductor substrate 100 or can stop at a distance to the semiconductor substrate 100.

The semiconductor substrate 100, or parts of it, can be doped to be of the second conductivity type to form a drain region 135. Alternatively, when the semiconductor substrate 100 is completely or partially removed, the exposed side of the epitaxial layer 120, i.e. the side which faces towards the semiconductor substrate 100, can be doped to form the drain region 135.

As exemplarily illustrated in FIG. 1D, adjacent transistor cells are spaced apart from each other by a given pitch d in lateral direction. According to an embodiment, the semiconductor device is a superjunction semiconductor device which includes transistor cells with superjunction semiconductor device structures having a comparably small pitch such as a pitch d of about 15 µm or less. According to further embodiments, the pitch d can be 12 µm or less such as 10 µm or less, particularly 7 µm or less and even more particularly 5.5 µm or less, such as 4 µm or less or even 3.5 µm or less. The pitch d may be the lateral distance of the centre lines of adjacent p-columns when seen in a vertical cross section, as for example illustrated in FIG. 1D.

As further illustrated in FIG. 1D, each transistor cell includes a gate electrode 142 which is electrically insulated from portions of the body region 132 by a gate dielectric 141. The gate electrode 142 controls the channel region in the body region 132 along the gate dielectric 141. The gate dielectric 141 may be formed by a dry oxidation in an atmosphere containing 5 to 100% oxygen.

The oxygen-out-diffusion anneal prior to the formation of the epitaxial layer 120 aims at reducing the concentration of oxygen at least in the first surface region 103, particularly in the first and second surface regions 103, 104 of the semiconductor substrate 100. The reduction of the oxygen concentration at least partially removes defects in the semiconductor substrate 100. The defects may originate from the manufacturing of the semiconductor substrate 100 using a Czochralski process. Semiconductor materials such as silicon formed by a Czochralski process may include an intrinsically high oxygen concentration which can lead to a number of defects in the semiconductor substrate 100. Typical defects are, for example, oxygen precipitates, which are also referred to as bulk micro defects (BMD). The BMD may act as gettering regions for removing metal impurities.

On the other hand, the BMD also influences the mobility of charge carriers. During formation and growth of oxygen precipitates in the semiconductor substrate, silicon self-interstitials are emitted from the growing oxygen precipitates. The silicon self-interstitials are silicon atoms which are placed at interstitial lattice sites. The silicon self-interstitials may also effect the mobility of charge carriers. A reduction of the charge carrier's mobility may affect the electrical conductivity and the thermal conductivity of the semiconductor material.

While the BMD are mainly formed in the semiconductor substrate 100, the presence of the BMD in the semiconductor substrate 100 also influences the formation of the epitaxial layer 120 close to the first side 101 of the semiconductor substrate 100. For example, silicon self-interstitials may be emitted from the BMD in the semiconductor substrate 100 and diffuse into the growing epitaxial layer 120. The emitted silicon self-interstitials may adversely affect the mobility of charge carriers in the epitaxial layer 120.

The oxygen-out-diffusion anneal prior to the epitaxial deposition significantly reduces the oxygen concentration in the first surface region 103 at the first side 101 of the semiconductor substrate 100 and thus also reduces out-diffusion of oxygen and emission of silicon self-interstitials into the growing epitaxial layer 120.

In addition to that, COPs may be reduced by the thermal oxidation anneal. Since the mobility of the charge carriers is not influenced, or only slightly influenced when the precipitates and/or COPs are removed, the electrical resistance of the epitaxial layer, defined as on-state resistance $R_{ON}$, can be kept at low value. In addition to that, it has been observed that the thermal conductivity of the epitaxial layer 120 and the semiconductor substrate 100 can be improved which is beneficial for dissipating heat generated during operation of the semiconductor devices.

The oxygen-out-diffusion anneal may include exposing the semiconductor substrate 100 to an oxygen and/or nitrogen atmosphere of constant or varying composition. The thermal oxidation anneal typically includes exposing the semiconductor substrate 100 to an oxidising atmosphere, which can lead to the formation of an oxide layer 105 on exposed surfaces of the semiconductor substrate 100 as illustrated in FIG. 18. The oxygen-out-diffusion anneal may also lead to the formation of an oxide layer. Without wishing to be tied to theory, it is believed that the oxide layer 105 may also act as gettering layer for oxygen in the semiconductor substrate 100. The out-diffusing oxygen may be trapped or gettered by the oxide layer 105 formed at the exposed surfaces of the semiconductor substrate 100. The oxide layer 105 may therefore at least partially be formed by the oxygen originated from the semiconductor substrate 100 so that the oxide layer 105 also grows from "the inside" of the semiconductor substrate 100.

According to an embodiment, the thermal oxidation anneal can be a wet oxidation in an atmosphere containing mainly oxygen and water-vapour. A wet oxidation in a moisture containing atmosphere is very effective to dissolve COPs. For example, oxygen can be fed through nearly boiling water to enrich the atmosphere with water vapour.

The oxide layer 105 is rather thin and may only be between 500 nm and 2500 nm thick, particularly between 1000 nm and 2500 nm, more particularly between 1000 nm and 2000 nm such as between 1000 nm and 1500 nm. According to an embodiment, the oxide layer 105 is removed after the thermal oxidation anneal or the oxygen-out-diffusion anneal and prior to the formation of the epitaxial layer 120.

According to an embodiment, a protective oxide layer may be deposited prior to the oxygen-out-diffusion anneal. The protective oxide layer may later be removed. The protective oxide layer prevents formation of a nitride layer when the oxygen-out-diffusion anneal is at least partially carried out in an atmosphere containing nitrogen.

In addition to the removal or reduction of the BMD leading to a substantially BML-free first and second surface regions 103, 104, the thermal anneal also contributes to a removal or reduction of so-called crystal originated particles or crystal originated pits, which are abbreviated as COPs. The COPs are basically voids in the crystal lattice which can have a size of about 50 to 100 nm. During thermal anneal, such as during the thermal oxidation anneal, the mobility of the silicon atoms, particularly of silicon self-interstitials, is increased. In addition to that, a thermal oxidation anneal in an oxidising atmosphere additionally creates highly mobile silicon self-interstitials during formation of the oxide layer 105. The silicon self-interstitials may diffuse to the COPs and efficiently dissolve or at least significant reduce the COPs.

According to an embodiment the thermal anneal, particularly the oxygen-out-diffusion anneal, brings about a reduction of the mean oxygen concentration below $6 \times 10^{17}$ cm$^{-3}$ in the first surface region 103, or in the first and the second surface regions 103, 104, at the first side 101 and the second side 102 of the semiconductor substrate 100, respectively. The surface region 103 may extend from the first side 101 to a depth in the semiconductor substrate 100 of at least 10 µm. According to an embodiment, the oxygen-out-diffusion anneal results in a reduction of the mean oxygen concentration below $4 \times 10^{17}$ cm$^{-3}$ in the first surface region 103.

Depending on the temperature and duration of the oxygen-out-diffusion anneal, the first surface region 103 may extend to a depth of at least 20 µm or more. A substantially defect-free zone can therefore be formed at the first side 101 of the semiconductor substrate 100, which defect-free zone extends to a depth of at least 10 µm, typically to a depth between 10 and 20 µm. Such defect-free zone is often referred to as denuded zone.

The time and duration of the oxygen-out-diffusion anneal is selected to induce and to increase out-diffusion of oxygen. According to an embodiment, the time and duration of the oxygen-out-diffusion anneal is set such that the out-diffusion of oxygen is maximised.

According to an embodiment, the oxygen distribution within the semiconductor substrate 100 shows a gradient towards the first side 101 of the semiconductor substrate 100. After forming the epitaxial layer 120, the gradient of the oxygen concentration extends from within the semiconductor substrate 100 towards the interface between the semiconductor substrate 100 and the epitaxial layer 120. The gradient can be, for example, verified using SIMS. According to an embodiment, the oxygen concentration in the semiconductor substrate 100 towards the interface between the semiconductor substrate 100 and the epitaxial layer 120 is at least 10% higher in a depth of 10 µm relative to the interface, particularly at least 20% higher.

At the interface between the semiconductor substrate 100 and the epitaxial layer 120, the doping concentration may strongly increase towards the semiconductor substrate 100 as the semiconductor substrate 100 may be significantly higher doped than the epitaxial layer 120. This sudden change in doping concentration may also be determined using SIMS or other suitable methods.

Figure 2A:
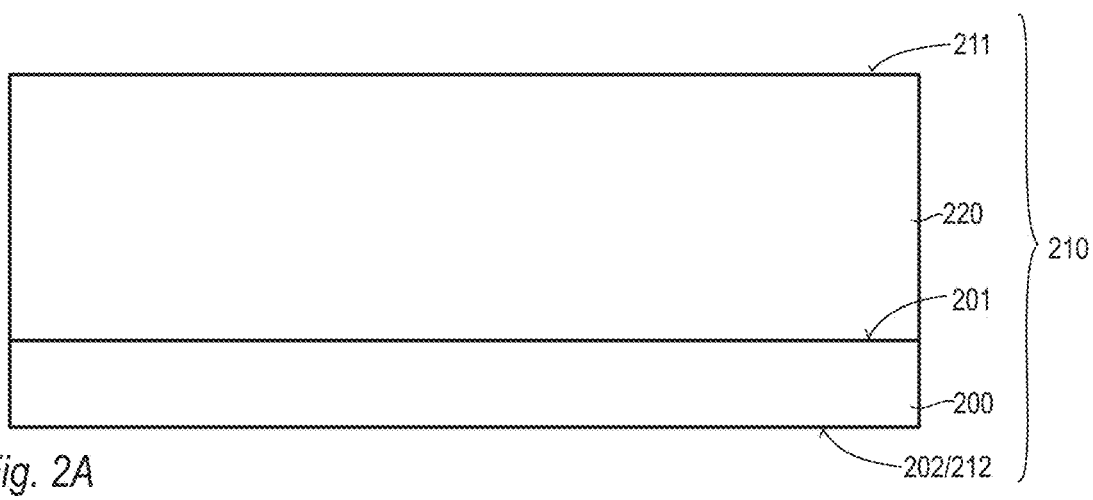
FIGS. 2A to 2C illustrate processes of a method for manufacturing semiconductor devices according to an embodiment.
Figure 2B:
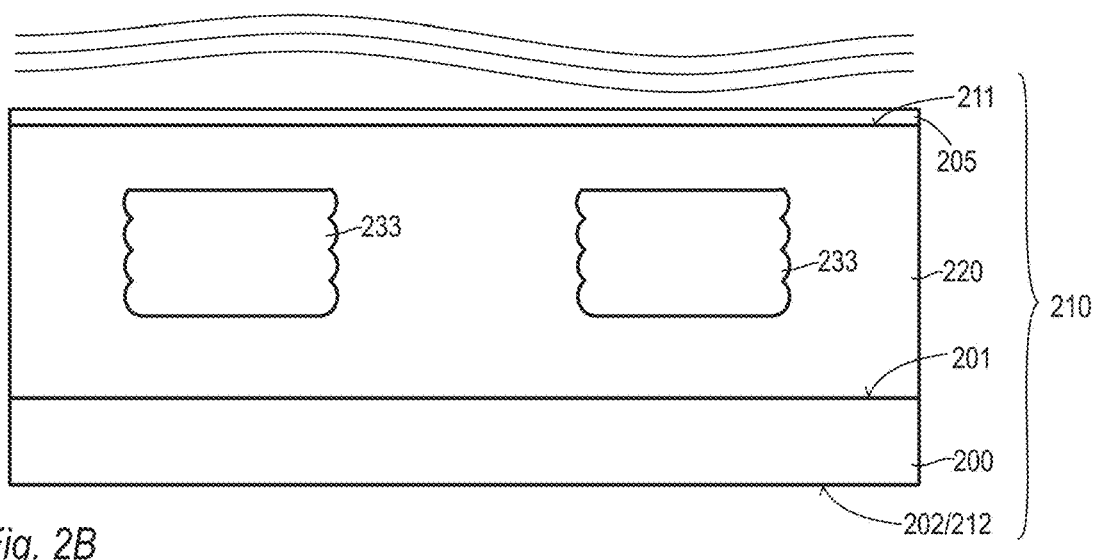
Figure 2C:
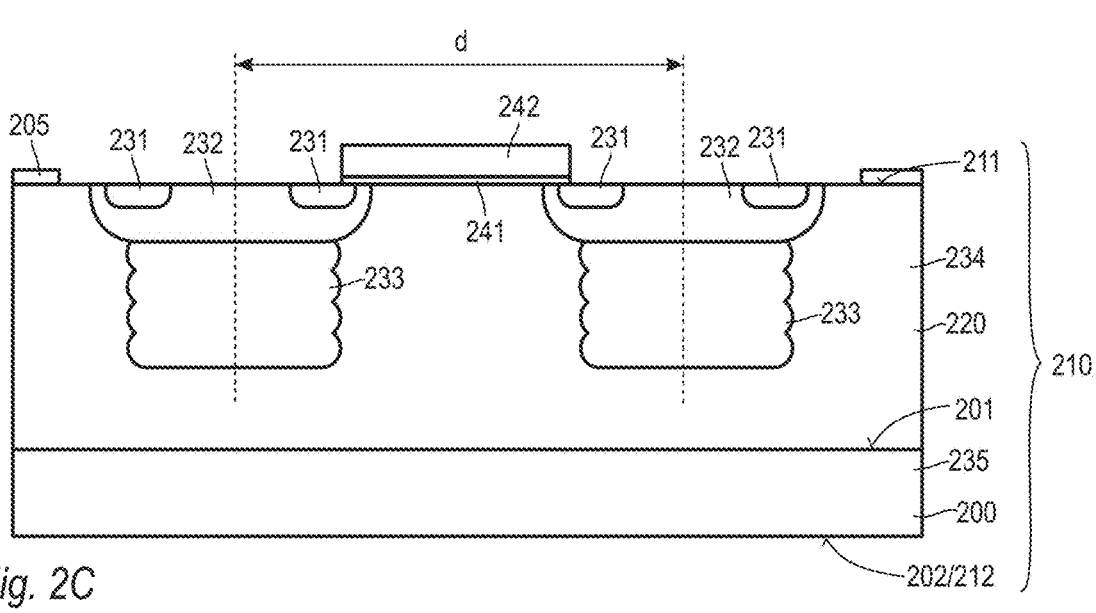

With reference to FIGS. 2A to 2C a method for manufacturing semiconductor devices according to a further embodiment is illustrated.

A semiconductor substrate 200 having an initial oxygen concentration of at least $6 \times 10^{17}$ cm$^{-3}$ is provided. The semiconductor substrate 200 has a first side 201 and a second side 202 opposite the first side 201. In a further process, as illustrated in FIG. 2A, an epitaxial layer 220 is formed on the first side 201 of the semiconductor substrate 200. The semiconductor substrate 200 forms together with the epitaxial layer 220 a semiconductor body 210 having a first side 211 formed by a surface of the epitaxial layer 220 and a second side 212, which is formed by the second side of the semiconductor substrate 200.

In further process steps, as illustrated in FIG. 2B, dopants are implanted into the epitaxial layer 220 for forming superjunction semiconductor device structures in the epitaxial layer 220. Subsequently to implanting, the epitaxial layer 220 is subjected to a thermal treatment, such as an oven process, at a temperature of at least 1050° C., particularly of at least 1100° C., and more particularly of at least 1150° C. for a sufficient time to diffuse the dopants in the epitaxial layer 220. According to an embodiment, the thermal treatment is carried out at a temperature of at least 1200° C. The diffusion of the dopants results in the formation of columns 233, such as p-columns, arranged in the epitaxial layer 220, which can be of n-type.

According to an embodiment, the thermal treatment may be a wet oxidation in an atmosphere containing mainly oxygen and water vapour. Alternatively, a dry oxidation may be used which employs an atmosphere having a small amount of oxygen such as between 5 and 10%. In each case, an oxide layer 205 may be formed at the first side of the epitaxial layer 220. Depending on the duration of the thermal treatment and the type of oxidation, i.e. wet oxidation in a moisture-containing atmosphere or dry oxidation, the thickness of the oxide layer 205 may be between 200 nm and 2500 nm, particularly between 500 nm and 2500 nm as described further above in connection with oxide layer 105.

According to an optional further process, the oxide layer 205 is at least partially removed. FIG. 2C illustrates the removal of the oxide layer 205 in a central part of the semiconductor body 210 corresponding to the so-called active area of each of the semiconductor device. The oxide layer 205 may remain on the semiconductor body 210 in a peripheral area forming the so-called edge termination area of the semiconductor device. Typically, the edge termination area surrounds the active area when seen in plan projection onto the first side 211 of the semiconductor body 210.

According to an embodiment, a protective oxide layer may be formed by deposition prior to the thermal treatment. The protective layer can later be removed as described in connection with the oxide layer 205, or together with the oxide layer 205.

According to further processes, as exemplified in FIG. 2C, a plurality of transistor cells is formed. Formation of the transistor cells includes formation of body regions 232 and formation of source regions 231 embedded in the body regions 232. The source regions 231 and the body regions 232 may be formed after the thermal treatment so that these regions are not subjected to the high-temperature thermal treatment used for diffusing the dopants for the p-columns 233.

As described in connection with the embodiment illustrated in FIGS. 1A to 1D, the spaced apart p-doped columns 233 form together with portions of the n-doped epitaxial layer 220 superjunction semiconductor device structures in the epitaxial layer 220. The p-columns 233 and the body regions 232 are formed such that they are in direct contact with each other. A respective one of the columns 233 is arranged below a respective one of the body regions 232.

The semiconductor transistor cells further include the drift region 234 formed by portions of the epitaxial layer 220, and a common drain region 235 formed by the semiconductor substrate 200. According to an embodiment, the drain region 235 is formed by the lower portion of the epitaxial layer 220 when the semiconductor substrate 200 is optionally removed.

Similar as shown in FIG. 1D, the semiconductor cells of FIG. 2C include gate electrodes 242 and gate dielectrics 241 arranged between respective gate electrodes 242 and the epitaxial layer 220.

The embodiment illustrated in FIG. 2A to 2C shows an alternative approach to the embodiment illustrated in FIG. 1A to 1D. The embodiment of FIGS. 2A to 2C does not employ a thermal anneal at high temperatures prior to epitaxial deposition of the epitaxial layer 220. Instead of having a thermal anneal as in the embodiment of FIGS. 1A to 1D, a thermal treatment at high temperatures is carried out after implanting dopants for the superjunction semiconductor device structures. Typically, a thermal treatment is needed after implanting the dopants for the superjunction semiconductor device structures in FIG. 1D. Such a thermal treatment is commonly carried out at medium temperatures. Different thereto, the thermal treatment of FIG. 2B is carried out at comparably high temperatures such as of at least 1050° C. Furthermore, the thermal treatment may also be carried out longer than usual such as at least 2 h or at least 3 h.

According to an embodiment, higher temperatures are used for the thermal treatment such as at least 1100° C. or at least 1150° C. In further embodiments, the target temperature for the thermal treatment is at least 1200° C. At such high temperatures, the diffusion of oxygen is significantly increased so that the oxygen precipitates formed in the semiconductor substrate start to dissolve. With increasing dissolution of the oxygen precipitates, the influence on the charge carrier mobility reduces and finally vanishes.

The thermal treatment after implanting dopants for the superjunction semiconductor device structures is particularly desirable when only one type of dopants such as p-type dopants are implanted for forming the p-columns. On the other hand, if both n-type dopants and p-type dopants are implanted for forming alternating p-columns and n-columns of the superjunction semiconductor device structures, the thermal anneal prior to implanting the dopants is particularly employed as this thermal anneal prior to epitaxial deposition improves diffusion of the dopants.

In both embodiments of FIGS. 1A to 1D and 2A to 2C, the superjunction semiconductor device structures are formed in the epitaxial layer by first implanting dopants, followed by a drive-in treatment, which can be the thermal treatment, followed by the formation of body regions and source regions after the drive-in treatment. In the embodiment of FIGS. 1A to 1D, the drive-in treatment may be carried out at medium temperatures such as below 1000° C., while in the embodiments of FIGS. 2A to 2C the drive-in is carried out at higher temperatures. According to an embodiment, the drive-in treatment of FIG. 1D may also be carried out at higher temperatures, such as at 1100° C., and in a moisture-containing atmosphere to additionally remove oxygen precipitates and COPs.

According to an embodiment, a thermal treatment at high temperatures of at least 1050° C., particularly of at least 1100° C., and more particularly of at least 1150° C., is carried out after implantation of the dopants into the epitaxial layer 120 even when the semiconductor substrate 100 was subjected to the thermal anneal. This further reduces defects and avoids that the mobility of the charge carriers is affected. The thermal treatment may be a wet oxidation in a moisture-containing atmosphere or a dry oxidation. For further improvement, the thermal anneal, particularly a thermal oxidation anneal, prior to epitaxial deposition and the thermal treatment after implantation can be carried out.

With reference to FIGS. 3A to 3K a more specific embodiment employing a thermal anneal prior to formation of the epitaxial layer is described.

Figure 3A:
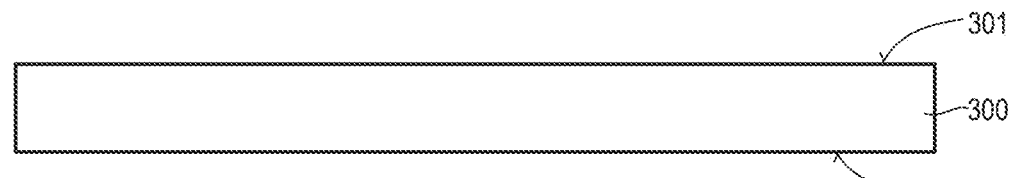
FIGS. 3A to 3K illustrate processes of a method for manufacturing semiconductor devices according to an embodiment.

As illustrated in FIG. 3A, a semiconductor substrate 300 having a first side 301 and a second side 302 is provided. The semiconductor substrate can have an initial oxygen bulk concentration of at least $6\times10^{17}$ cm$^{-3}$. As described in connection with FIG. 1B, the thermal anneal is carried out to form surface regions 303, 304 at the first side 301 and the second side 302, respectively, having a reduced oxygen concentration.

The thermal anneal may include at least a thermal oxidation anneal. An optional oxygen-out-diffusion anneal can be carried out prior to the thermal oxidation anneal. An oxide layer 305 may be formed during the thermal anneal. The oxide layer 305 is removed prior to a following epitaxial deposition of an epitaxial layer.

Figure 3B:
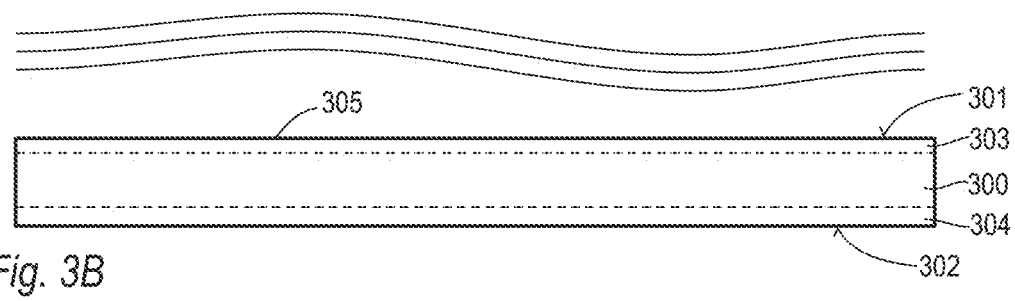
Figure 3C:
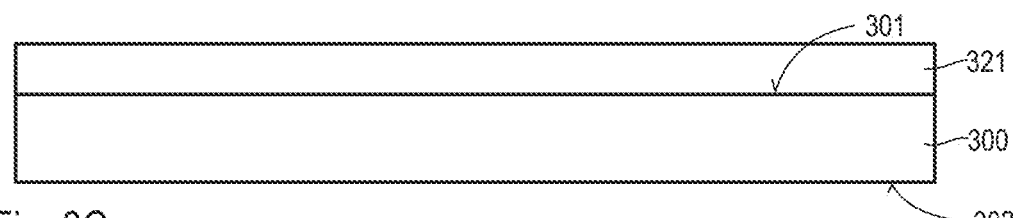

In further processes as illustrated in FIG. 3C to 3J, an epitaxial layer 320 is stepwise formed with intermediate implantation steps to form p-doped columns 333 and n-doped columns 334. A first epitaxial sublayer 321 is grown on the first side 301 of the semiconductor substrate 300 followed by forming of a first mask 351-1 which exposes only those regions of the first epitaxial sublayer 321 were p-type dopants shall be implanted. FIG. 3B illustrates the implantation of p-dopants into the first epitaxial sublayer 321 resulting in the formation of first doping regions 333-1 of the first conductivity type in the first epitaxial sublayer 321.

Figure 3D:
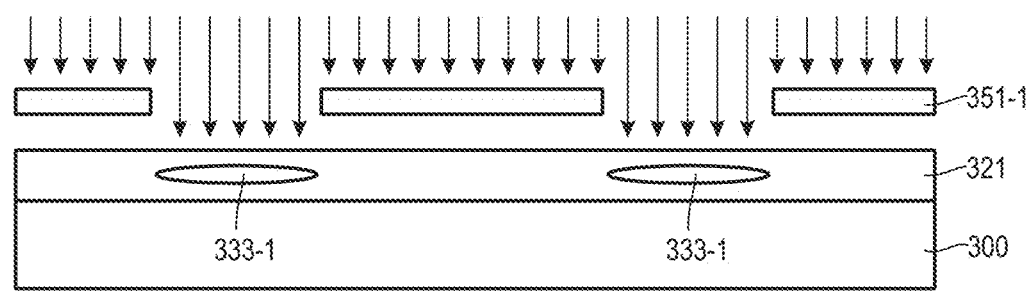
Figure 3E:
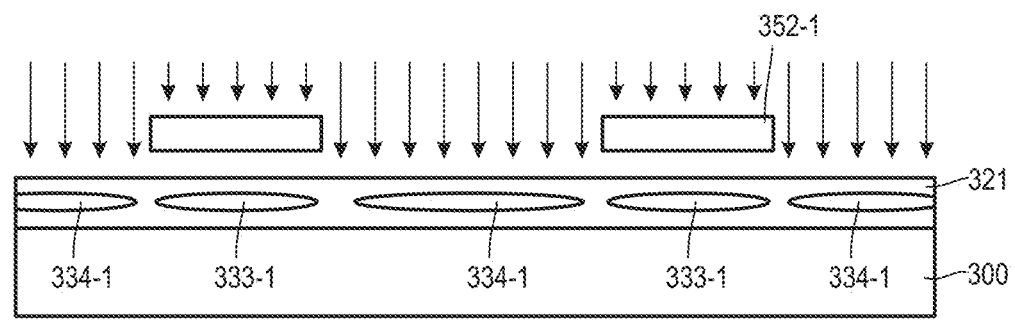

In a further process, as illustrated in FIG. 3E, a second mask 352-1 is formed on the first epitaxial sublayer 321. The second mask 352-1 can be, in sections, substantially of complimentary shape to the first mask 35:1-1 so that the regions, which were covered by the first mask 351-1, are now exposed, and regions, which were exposed by the first mask 351-1, are now covered by the second mask 352-1. For example, the first mask 351-1 and the second mask 352-1 can be complementary in the so-called active area of the semiconductor device where the active transistor cells are formed. FIG. 3E illustrates implantation of n-dopants into the first epitaxial sublayer 321 to form second doping regions 334-1.

The p-dopants form dopants of a first conductivity type while the n-dopants form dopants of a second conductivity type.

Figure 3F:
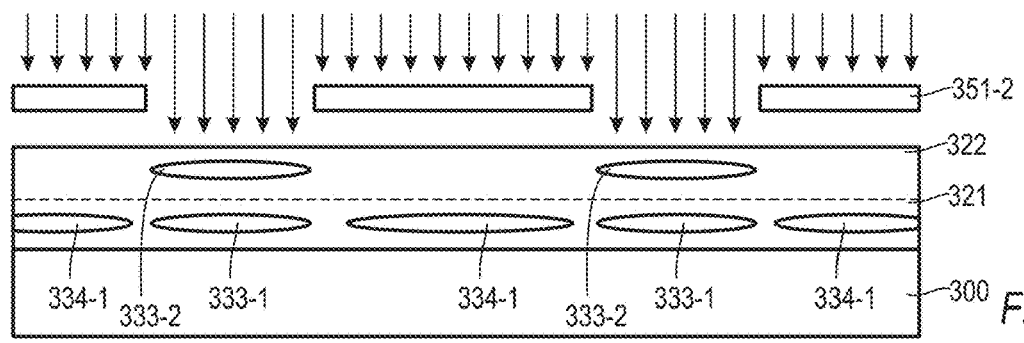
Figure 3G:
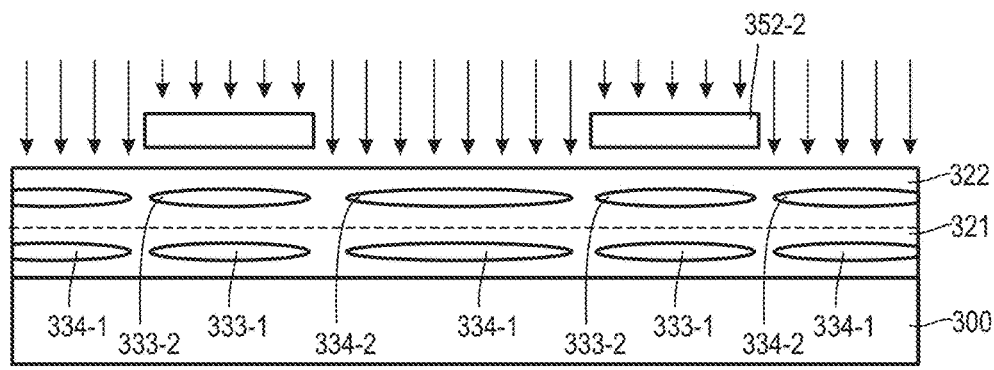
Figure 3H:
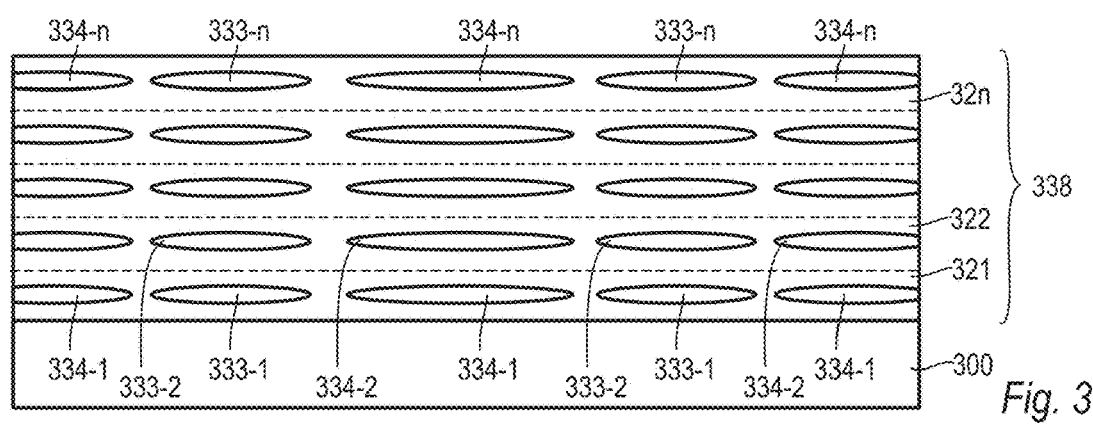

The processes illustrated in FIGS. 3D and 3E are repeated in FIGS. 3F and 3G for a plurality of time. FIGS. 3D and 3E show the formation of a second epitaxial sublayer 322 on the first epitaxial sublayer 321. The processes illustrated in FIGS. 3D and 3E may be repeated n-times so that n epitaxial sublayers 321 to 32n are stacked on each other which together form an epitaxial sublayer stack 338. Each of the n epitaxial sublayers 321 to 32n include first doping regions 333-1 to 333-n of the first conductivity type and second doping regions 334-1 to 334-n of the second conductivity type as illustrated in FIG. 3H.

Figure 3I:
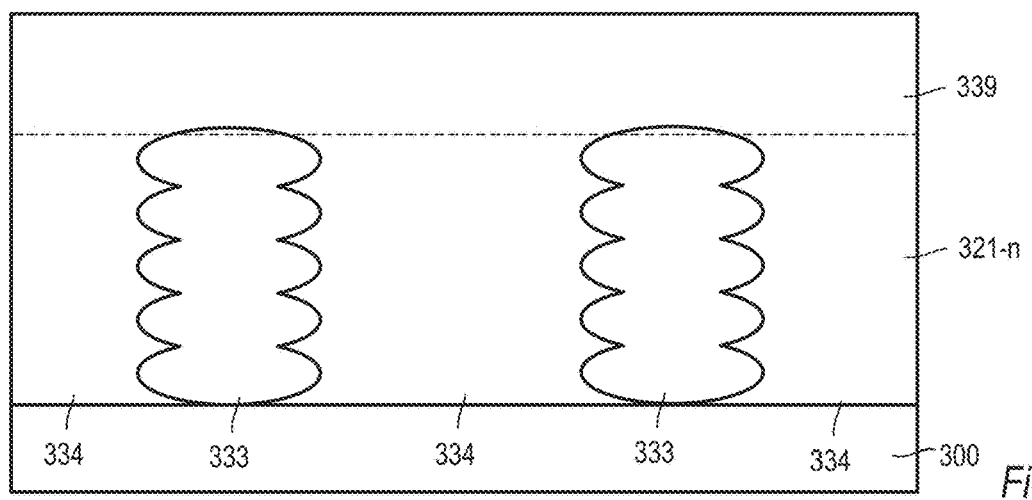

In a further process, as illustrated in FIG. 3I, a top epitaxial sublayer 339 is formed on the plurality of epitaxial sublayers 321 to 32n, i.e. on the epitaxial sublayer stack 338. The epitaxial sublayer stack 338 forms together with the top epitaxial sublayer 339 the epitaxial layer 320.

In a further process as illustrated in FIG. 3I, the previously formed epitaxial sublayer stack 338 including the n epitaxial sublayers 321 to 32n is subjected to a thermal treatment for driving-in the previously implanted dopants and to form n-columns 334 between adjacent p-columns 333. These columns form together the superjunction semiconductor device structures. The p-columns 333 are also referred to as compensation regions as these columns provide the compensation charges for the n-doped columns regions which form part of the current path of the semiconductor device.

Figure 3J:
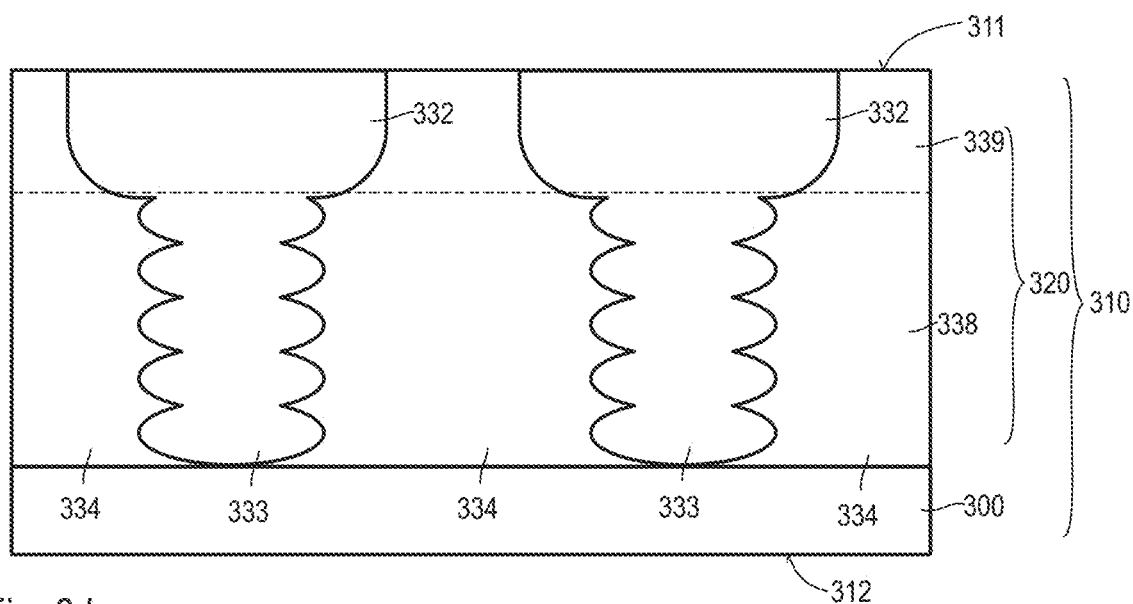

In a further process, as illustrated in FIG. 3J, the body regions 332 are formed in the top epitaxial sublayer 339 to be arranged above the respective p-columns 333.

Forming the epitaxial layer 320 by multiple depositions of sublayers allows tailoring of the background doping concentration of each sublayer and varying the doping concentration of the first doping regions 333-1 to 333-n and the second doping regions 334-1 to 334-n. For example, the top epitaxial sublayer may be formed to have a higher doping concentration than the n-columns 334.

The epitaxial layer 320 form together with the semiconductor substrate 300 a semiconductor body 310 having a first side 311 formed by an upper side of the epitaxial layer 320 and a second side 312 formed by the second side 302 of the semiconductor substrate 300. The interface between the epitaxial layer 320 and the semiconductor substrate 300 is at the first side 301 of the semiconductor substrate 300. At this interface, a jump of the doping concentration may be observed as the semiconductor substrate 300 may be significantly higher doped than the epitaxial layer 320.

In further processes, the source regions 331 are formed in the body regions 332 followed by formation of gate dielectrics 341 and gate electrodes 342, respectively. For completing the semiconductor devices, an insulation layer 343 is formed on the first side 311 of the semiconductor body 310 to cover the gate electrodes 342. Openings in the insulation layer 343 are formed to provide access to the source regions 331 and the body regions 332. The openings are filled with a conductive material such as polysilicon to form source contacts 344. A source metallisation 345 is formed on the insulation layer 343 to be in contact with the source contacts 344, so that the source metallisation 345 is in ohmic contact with the source regions 331 and body regions 332 through the source contacts 344.

A drain metallisation 346 is formed on the second side 312 of the semiconductor body 310 to be in ohmic contact with the semiconductor substrate 300 which forms the drain region 335 of the semiconductor devices.

Figure 3K:
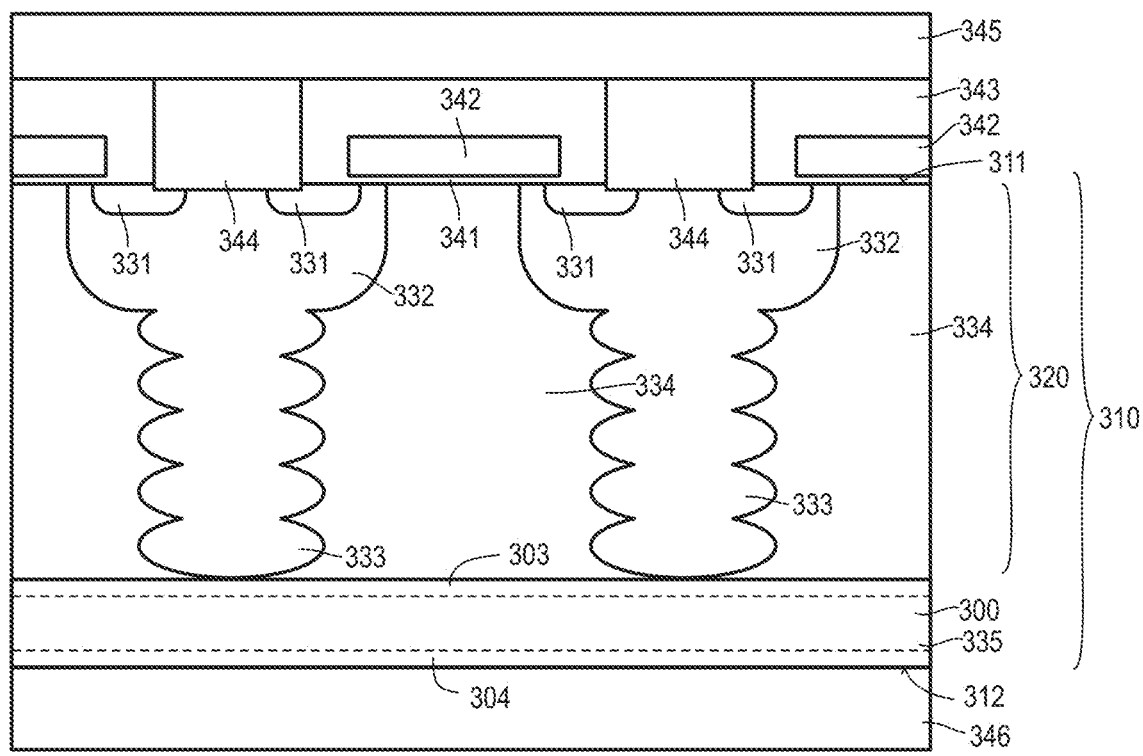

FIG. 3K also illustrates the first and second surface regions 303, 304 previously formed by the thermal anneal, particularly by the oxygen-out-diffusion anneal. The first and the second surface regions 303, 304 showing a reduced oxygen concentration relative to a central portion of the semiconductor substrate 300 remain detectable in the final semiconductor devices.

Figure 4A:
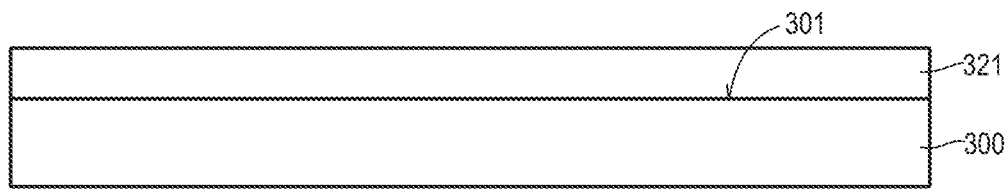
FIGS. 4A to 4G illustrate processes of a method for manufacturing semiconductor devices according to an embodiment.
Figure 4B:
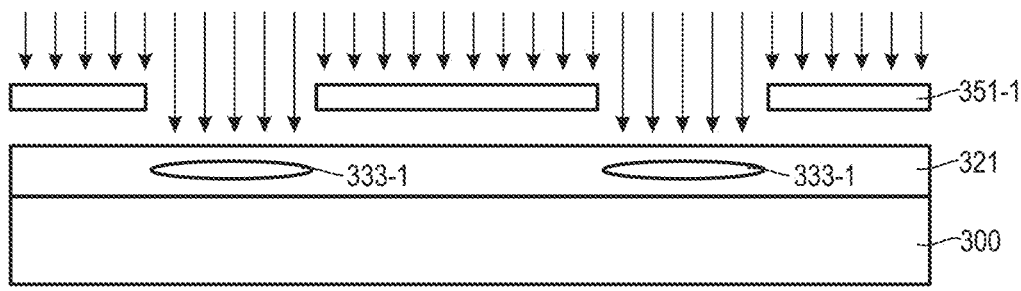
Figure 4C:
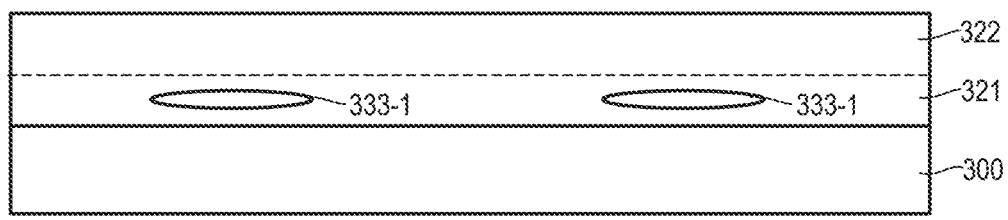

With reference to FIG. 4A to 4G a more specific embodiment relative to the embodiment of FIGS. 2A to 2C is described. The processes start with providing a semiconductor substrate 300, followed by epitaxial deposition of a first epitaxial sublayer 321 on the first side 301 of the semiconductor substrate 300 as for example described in connection with FIG. 3C. In a further process as illustrated in FIG. 4B, first doping regions 333-1 of the first conductivity type are formed in the first epitaxial sublayer 321 using a first mask 351-1. The processes illustrated in FIG. 4B are similar to the processes illustrated in FIG. 3D.

Optionally, a thermal anneal including an oxygen-out-diffusion anneal and/or a thermal oxidation anneal can be carried out prior to forming the first epitaxial sublayer 321.

Different to the embodiment of FIGS. 3A to 3K, a second epitaxial sublayer 322 is formed on the first epitaxial sublayer 321 after forming the first doping regions 333-1 without additionally implanting dopants of the second conductivity type. This means that an implantation for forming the second doping regions as described in connection with FIG. 3E is not needed. Instead of having an additional implantation for forming the second doping regions, the embodiment of FIGS. 4A to 4G forms the epitaxial sublayers such that the sublayers are sufficiently intrinsically doped during epitaxial deposition. An intrinsic doping of the sublayers during epitaxial deposition is not necessarily carried out in the embodiment of FIGS. 3A to 3K. It is, however, also be possible to intrinsically dope the sublayers during epitaxial deposition and additionally implant dopants of the second conductivity type to form the second doping regions 334-1 to 334-n as illustrated, for example, in FIGS. 3E and 3G. When combining intrinsic doping of the epitaxial sublayers, so that the sublayers are of the second conductivity type, and additionally implanting doping of the second conductivity type in each, or in selected one, of the epitaxial sublayers, n-columns 334 having a higher doping concentration than other regions of the epitaxial layer can be formed.

Figure 4D:
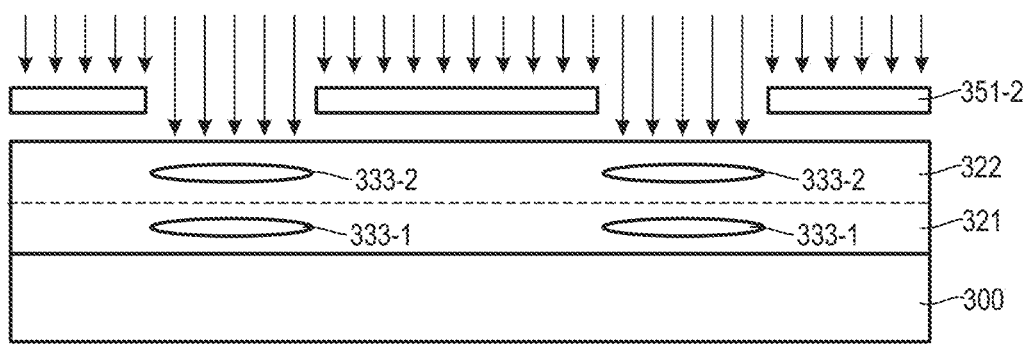
Figure 4E:
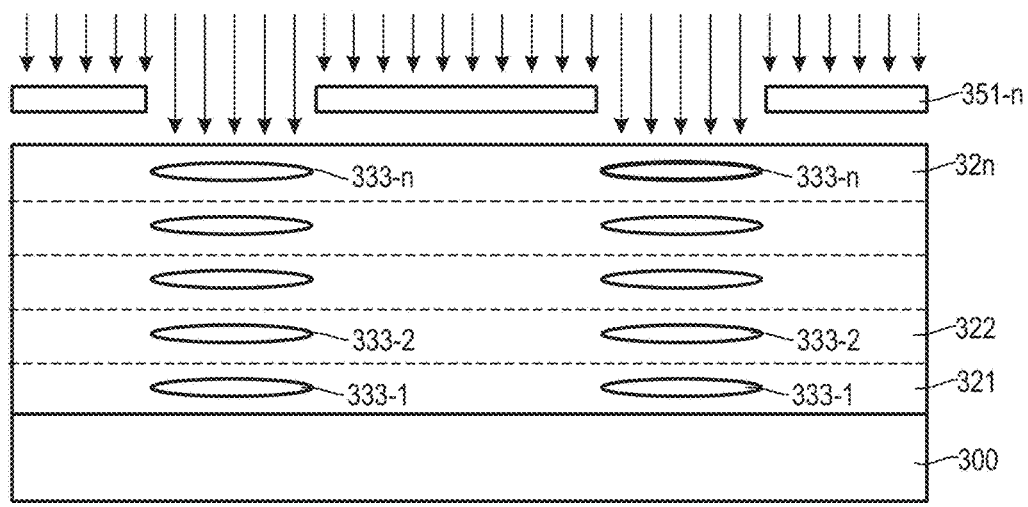
Figure 4F:
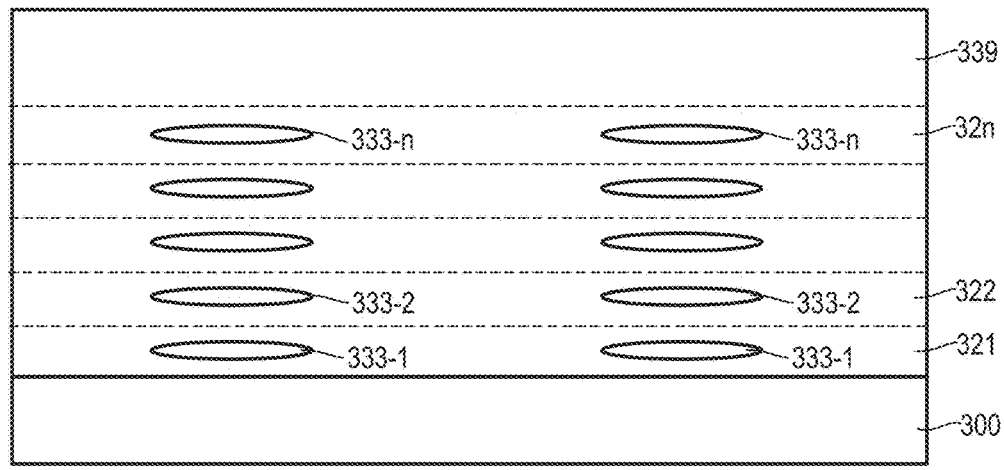

The processes of forming an epitaxial sublayer followed by implanting dopants of the first conductivity type to form first doping regions are repeated a plurality of time as illustrated in FIGS. 4D and 4E. The plurality of the formed epitaxial sublayers 321 to 32n forms the epitaxial sublayer stack 338 comprising a plurality of first doping regions 333-1 to 333-n.

Figure 4G:
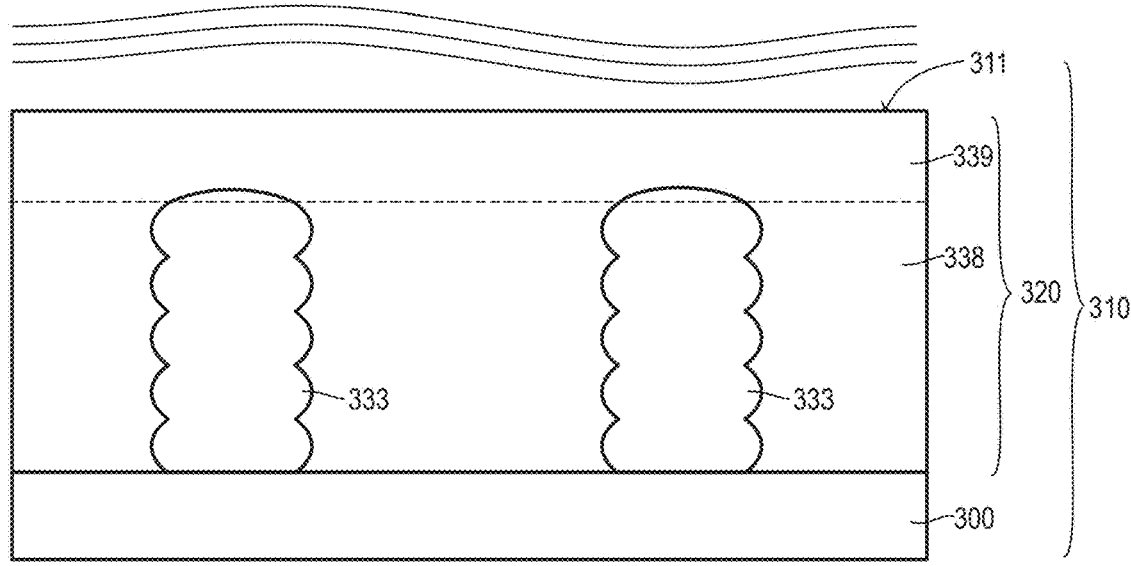

FIG. 4G further indicates the formation of the top epitaxial sublayer 339 on the epitaxial sublayer stack 338. The epitaxial sublayer stack 338 form together with the top epitaxial sublayer 339 the epitaxial layer 320, which together with the semiconductor substrate 300 forms the semiconductor body 310.

A subsequent thermal treatment similar to the thermal treatment carried out in the processes of FIGS. 2B and 3I leads to a driving-in of the first dopants and to the formation of columns 333 of the first conductivity type within the epitaxial sublayer stack 338. The vertically extending columns 333 may have a corrugated external shape when seen in a vertical cross-section as illustrated in FIG. 4G. Since driving-in of the first dopants occur against a substantially homogeneous background doping of the epitaxial sublayer stack, the previously formed bubble-like first doping regions 333-1 to 333-n expand and merge together so that the outer boundary of the resulting columns 333, forming pn-junctions with the surrounding semiconductor material of the epitaxial sublayer stack 338, has a corrugated shape.

During thermal treatment, an oxide layer may be formed on the first side 311 of the semiconductor body 310. Alternatively, a protective oxide layer may be formed prior to the thermal treatment. In any case, the oxide layer and the protective oxide layer may be at least partially removed after the thermal treatment.

The outer shape in a vertical cross-section of the respective columns 333 and 334 as formed in FIG. 3I may also have a corrugated or wave shape.

The further processes may be similar to the processes as explained in connection with FIGS. 3J and 3K.

Both of the embodiments of FIGS. 3A to 3K and 4A to 4G includes formation of an epitaxial sublayer stack 338, having a plurality of epitaxial sublayers with doping regions formed therein after deposition of the respective epitaxial sublayer, followed by drive-in, or thermal treatment, to form the superjunction semiconductor device structures in the epitaxial sublayer stack 338. A top epitaxial sublayer 339 is deposited onto the epitaxial sublayer stack 338 prior to the drive-in to complete the epitaxial layer 330. Body and source regions and formed in the top epitaxial sublayer 339 after the thermal treatment.

Figure 5A:
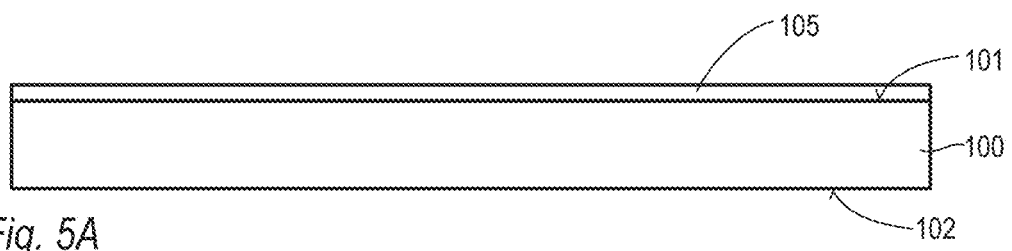
FIGS. 5A to 5C illustrate processes of a method for manufacturing semiconductor devices according to an embodiment.
Figure 5B:
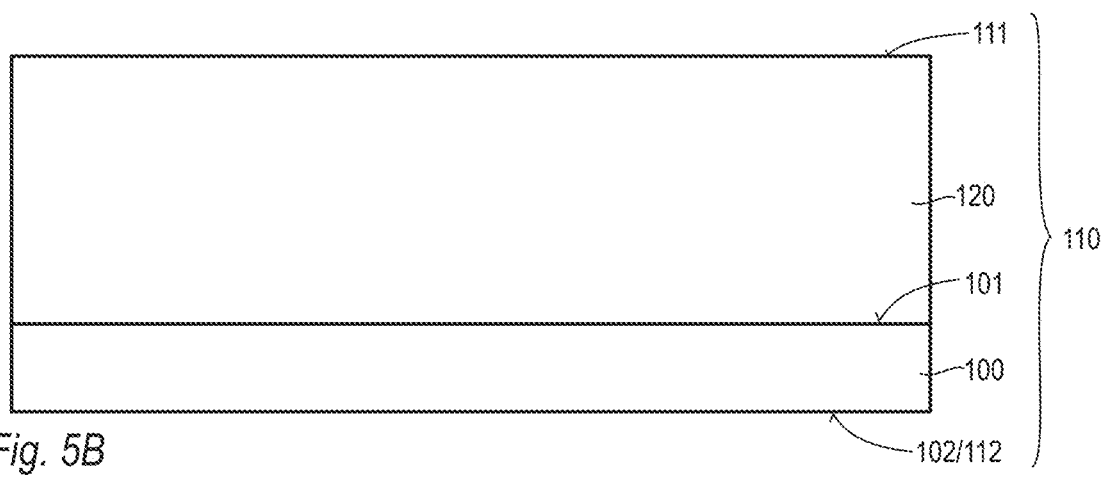
Figure 5C:
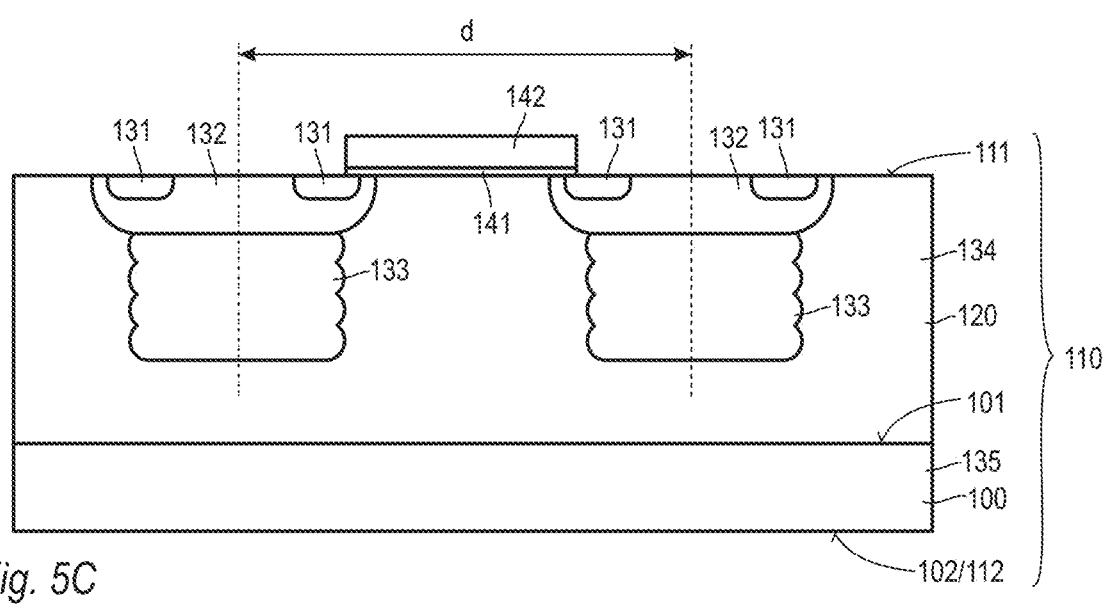

FIGS. 5A to 5C illustrates a further embodiment of a method for manufacturing semiconductor devices. This embodiment is similar to the embodiment of FIGS. 1A to 1D except that the semiconductor substrate 100 is provided with an initial oxygen concentration of less than $6\times10^{17}$ cm$^{-3}$, for example less than $5\times10^{17}$ cm$^{-3}$ or even less than $4\times10^{17}$ cm$^{-3}$, at least in a surface region of the semiconductor substrate 100. Providing the semiconductor substrate 100 with a reduced initial oxygen concentration may allow to dispense with the oxygen-out-diffusion anneal. This reduces manufacturing costs. It is therefore possible to form the epitaxial layer on the semiconductor substrate 100, as illustrated in FIG. 5B, without subjecting the semiconductor substrate 100 to a thermal anneal as illustrated in connection with the embodiment of FIGS. 1A to 1D. The following processes, as illustrated in FIG. 5C, may be the same as illustrated and described in connection with FIG. 1D. An optional thermal oxidation anneal can be carried out to remove the COPs. The oxide layer 105 resulting from the thermal oxidation anneal is subsequently removed.

The embodiment of FIGS. 5A to 5C may include a thermal treatment as described in connection with the embodiment of FIG. 2A to 2C or 4A to 4G after implantation. The thermal treatment is, however, optional. A standard drive-in at a temperature lower than the temperature of the thermal treatment may be sufficient.

The embodiment of FIGS. 3A to 3I may be modified by providing a semiconductor substrate 300 with an initial oxygen concentration of less than $6\times10^{17}$ cm$^{-3}$, for example less than $5\times10^{17}$ cm$^{-3}$ or even less than $4\times10^{17}$ cm$^{-3}$, and by dispensing with the oxygen-out-diffusion anneal as described in connection with FIG. 3B.

Subjecting the semiconductor substrate to a thermal anneal having at least one of the oxygen-out-diffusion anneal and the thermal oxidation anneal prior to epitaxial deposition is particularly beneficial for superjunction semiconductor device structures of transistor cells having a small pitch such as a pitch of 15 μm or less, particularly 12 μm or less. The smaller the pitch, the more precisely the prevention of precipitates and COPs must be controlled to obtain well-defined superjunction semiconductor device structures having a low on-state resistance $R_{ON}$ and a high thermal conductivity to efficiently dissipate heat.

FIGS. 6A to 6C illustrates various modifications of the methods as described herein. The process indicated by dashed lines in FIGS. 6A to 6C are optional processes.

FIG. 6A illustrates a variation starting from a semiconductor substrate having a high oxygen concentration such as higher than $6\times10^{17}$ cm$^{-3}$. The thermal anneal can therefore include the oxygen-out-diffusion anneal, simply referred to as oxygen out diffusion in FIGS. 6A to 6C, followed by the thermal oxidation anneal, which is referred to as COP-anneal in FIGS. 6A to 6C. After removal of the oxide layer, which is formed during the COP-anneal, the epitaxial layer is formed followed by the formation of the superjunction semiconductor device structures. The thermal treatment can optionally follow.

When starting from a semiconductor substrate having a lower oxygen concentration such as lower than $6\times10^{17}$ cm$^{-3}$, for example lower than $5\times10^{17}$ cm$^{-3}$ at least in surface regions of the semiconductor substrate, an oxygen-out-diffusion anneal is not needed but can optionally be carried out to further reduce the oxygen concentration (FIG. 6B). The remaining processes can be the same as in FIG. 6A.

Alternatively, when starting from a semiconductor substrate having a high oxygen concentration such as higher than $6\times10^{17}$ cm$^{-3}$, the thermal anneal including the oxygen-out-diffusion anneal and/or the thermal oxidation anneal (COP-anneal) can be dispensed with if a thermal treatment at sufficiently high temperatures is carried out after epitaxial deposition and formation of the superjunction semiconductor devices structures. However, the thermal oxidation anneal (COP-anneal) followed by the removal of the oxide layer are typically carried out prior to the epitaxial deposition. It is also possible to additionally have the oxygen-out-diffusion anneal prior to the thermal oxidation anneal (COP-anneal).

The impact of the thermal anneal has been experimentally verified. The results are illustrated in FIGS. 8 and 9.

Figure 8:
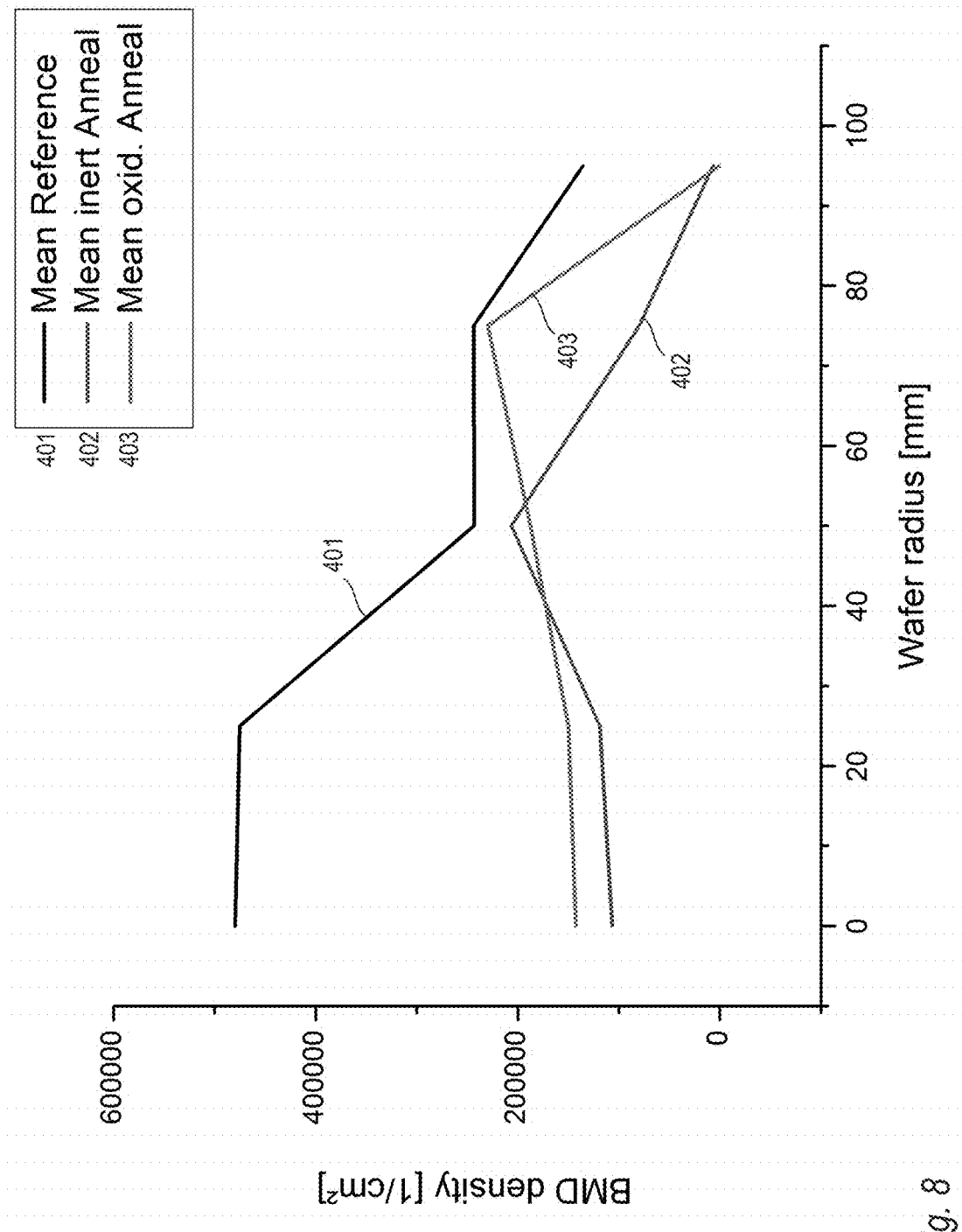
FIG. 8 shows the bulk micro defect density depending on the wafer radius for different anneals.

FIG. 8 illustrate evaluation results of the BMD density in the semiconductor wafers which were subjected to a thermal anneal. A reference, represented by line 401, is given to show the BMD density in a semiconductor wafer which has not been subjected to a thermal anneal. The impact of the thermal anneal including the oxygen-out-diffusion anneal is particularly pronounced in a central region of the wafer. Line 402 indicates a thermal anneal in an inert nitrogen atmosphere at about 1200° C. for 300 min, wherein the semiconductor wafer was heated up with heating rate of about 15° C./min. Line 403 represents the evaluation for a thermal anneal in an oxidising atmosphere at about 1200° C. for 180 min, ramped up with the heating rate of about 10° C./min.

An additional positive effect of an oxygen out-diffusion prior to the epitaxial deposition is that this also reduces the undesired diffusion of silicon self-interstitials into the subsequently deposited epitaxial layer. The risk that thermal donors are formed in the lower region of the epitaxial layer where the superjunction semiconductor device structures are formed can be significantly reduced. Thermal donors such as oxygen precipitates may interface with the charge carriers and reduce their mobility.

Figure 9:
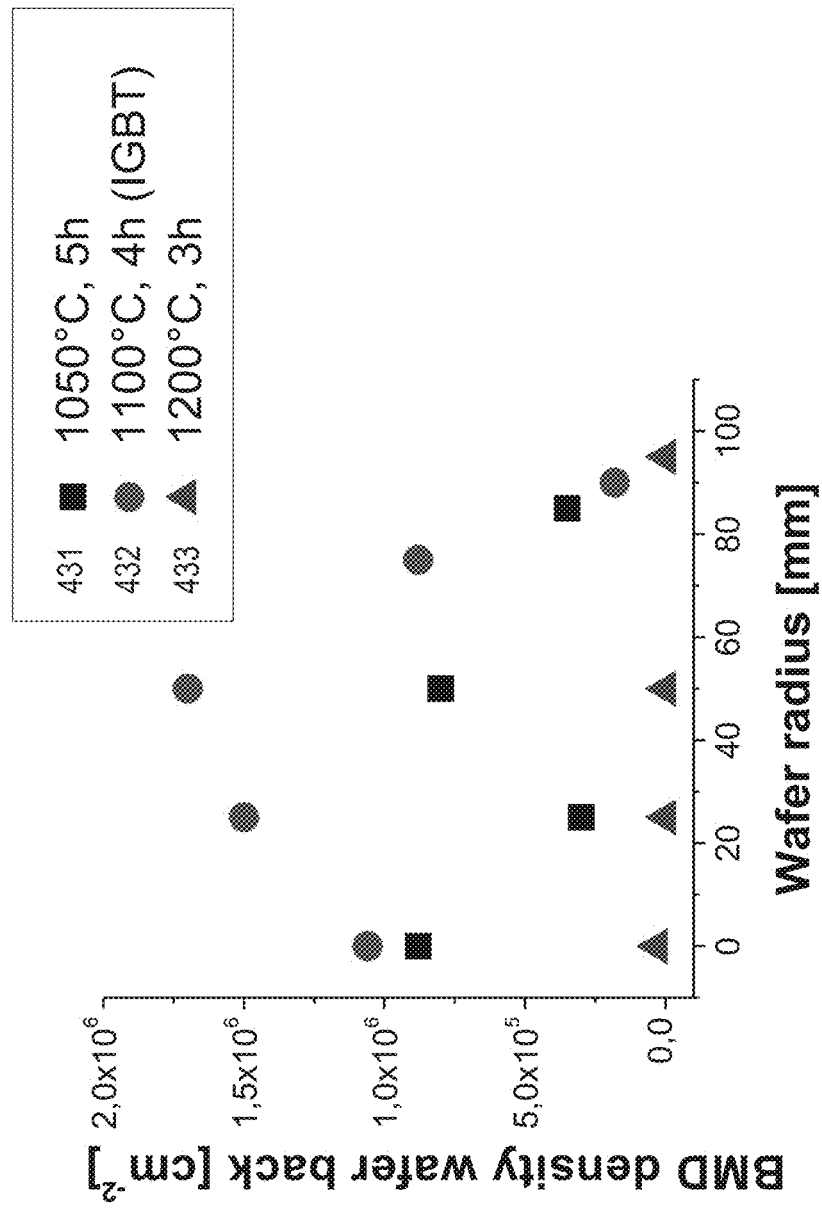
FIG. 9 shows the bulk micro defect density for anneals at different temperature and duration.

FIG. 9 shows the bulk micro defect density for thermal treatments after epitaxial deposition to drive-in dopants at different temperature and duration. For example, long lasting oven processes can be used as thermal treatments. When appropriately selecting the temperature for the thermal treatment, BMD contained in the semiconductor substrate and the epitaxial layer can be dissolved. When using such thermal treatments for driving-in the dopants, an additional thermal anneal of the semiconductor substrate prior to the epitaxial deposition of the epitaxial layer is not needed but can optionally be carried out.

FIG. 9 illustrate evaluation results for the silicon wafers which were not subjected to a pre-epitaxial thermal anneal. The duration and temperature for each of the thermal treatments are given in FIG. 9. The BMD density was determined after the respective thermal treatment.

As can be clearly derived from FIG. 9, virtually no BMD are observable for thermal treatments at 1200° C. At such high temperature, previously formed BMD dissolve and the oxygen may evaporate from the surface of the semiconductor material. When the thermal treatment is carried out in an oxidising or at least partially oxidising surface, the oxide layer formed on the surface of the semiconductor material may act like a gettering layer for the oxygen released from the BMD.

The BMD density is particularly pronounced for a treatment at 1100° C. if not long enough. At this temperature, oxygen precipitates are comparably stable so that a long thermal treatment may be needed for dissolving the precipitates. When comparing the thermal treatment at 1100° C. with the thermal treatment at 1050° C. it is observable that a longer duration may lead to a further reduction of the BMD concentration.

Figure 10:
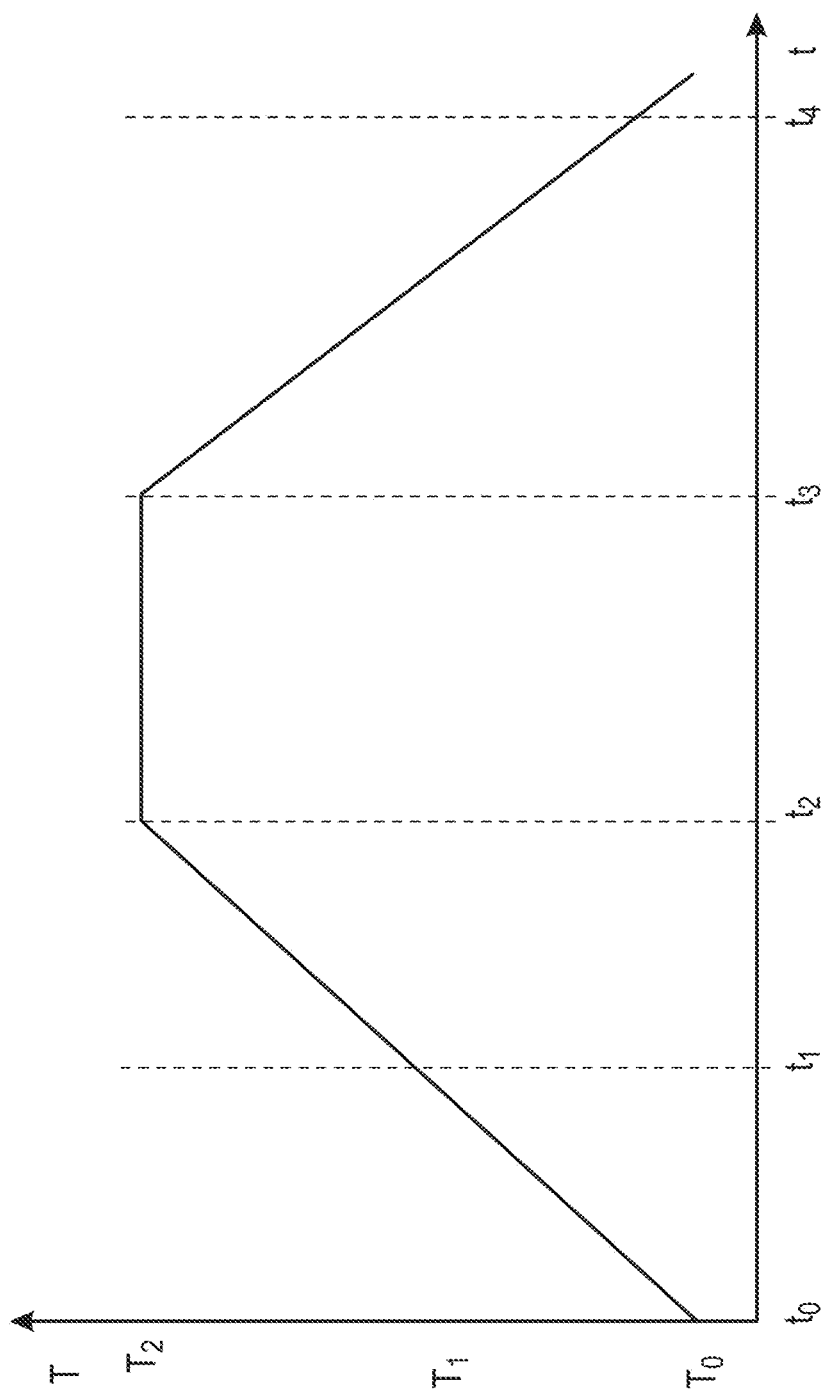
FIG. 10 shows a temperature profile for an anneal according to an embodiment.

FIG. 10 shows a temperature profile for an oxygen-out-diffusion anneal or thermal treatment according to an embodiment. The oxygen-out-diffusion anneal, or the thermal treatment, may start at $t_0$ at ambient temperature $T_0$. The temperature of the semiconductor substrate may be ramped up at constant heating rate to the maximum temperature $t_2$, where the semiconductor substrate is kept for a time from $t_2$ to $t_3$. After that, the semiconductor substrate is cooled down at a given rate.

When heating up the semiconductor substrate, the initial atmosphere may be adapted to be nitrogen poor during the first heating phase from $t_0$ to $t_1$ to avoid formation of a silicon nitride layer on the first and second side of the semiconductor substrate. The atmosphere of the first heating phase typically contain oxygen to initiate formation of an oxide layer on the first and second side of the semiconductor substrate. During a second heating phase after the first heating phase, for example after $t_1$, nitrogen may be added to the atmosphere to render the atmosphere inert. Alternatively, the atmosphere can contain a mixture of oxygen and nitrogen. Since a protective oxide layer has been formed during the first heating phase, formation of a silicon nitride layer is prevented.

Instead of forming a protective oxide layer by oxidation, an oxide layer may also be formed by deposition according to an embodiment. The deposition is carried out prior to the oxygen-out-diffusion anneal, or prior to the thermal treatment.

According to an embodiment, the semiconductor substrate is a silicon material having an initial oxygen bulk concentration of at least $6\times10^{17}$ cm$^{-3}$ as determined by SIMS. The semiconductor substrate can be subjected to a higher thermal anneal at a temperature of at least 1200° C. in an oxygen and/or nitrogen-containing atmosphere for at least 2 h, typically for about 3 h to dissolve oxygen precipitates and COPs. An epitaxial layer is subsequently deposited on the semiconductor substrate, followed by the integration of semiconductor devices having superjunction semiconductor device structures in the epitaxial layer.

According to a further embodiment, the semiconductor substrate is a silicon material having an initial oxygen bulk concentration of at least $6\times10^{17}$ cm$^{-3}$ as determined by SIMS. An epitaxial layer is at least partially formed on the semiconductor substrate, followed by implanting of dopants for the formation of superjunction semiconductor device structures in the epitaxial layer. A long thermal treatment at temperatures between 1150° C. and 1250° C., or even higher, is subsequently carried out to drive-in the implanted dopants and to form the superjunction semiconductor device structures in the epitaxial layer.

With reference to FIGS. 1D, 2C and 3K, a semiconductor device according to embodiments includes a semiconductor substrate 100, 200, 300 having a bulk oxygen concentration of at least $6\times10^{17}$ cm$^{-3}$, and an epitaxial layer 120, 220, 320 on the first side 101, 201, 301 of the semiconductor substrate 100, 200, 300. The epitaxial layer 120, 220, 320 and the semiconductor substrate 100, 200, 300 having a common interface 101, 201, 301. A superjunction semiconductor device structure is formed in the epitaxial layer 120, 220, 320. An interface region 103, 203, 303 extends from the common interface 101, 201, 301 into the semiconductor substrate 100, 200, 300 to a depth of at least 10 μm, wherein the mean oxygen concentration of the interface region 103, 203, 303 is lower than the bulk oxygen concentration of the semiconductor substrate 100, 200, 300. The interface region may correspond to the surface region formed by the thermal anneal such as the oxygen-out-diffusion anneal as described above.

The mean oxygen concentration of the interface region 103, 203, 303 may be at least 30% lower than the bulk oxygen concentration of the semiconductor substrate 100, 200, 300. The reduction of the oxygen concentration of the interface region is a result of a thermal anneal prior to the position of the epitaxial layer and/or a thermal treatment after implanting dopants for the superjunction semiconductor device structure.

According to embodiments as exemplified in FIGS. 1D, 2C and 3K, the interface region 103, 303 extends from the common interface 101, 301 into the semiconductor substrate 100, 300 to a depth of at least 20 μm.

The semiconductor substrate 100, 300 may have a bulk oxygen concentration of at least $7\times10^{17}$ cm$^{-3}$.

According to further embodiments, the semiconductor substrate has a bulk micro defect density of less than $10^4$ cm$^{-2}$, particularly less than as $10^3$ cm$^{-2}$ as for example illustrated in FIG. 9.

According to embodiments, the semiconductor substrate is a CZ material, which can be referred to as CZ-semiconductor substrate. The CZ-semiconductor substrate can have an initial oxygen bulk concentration of less than $6\times10^{17}$ cm$^{-3}$, particularly less than $5\times10^{17}$ cm$^{-3}$, such as less than $4\times10^{17}$ cm$^{-3}$. When providing a CZ-semiconductor substrate with a sufficiently low initial oxygen concentration, a thermal anneal and/or a thermal treatment may not be needed which reduces the manufacturing costs for the semiconductor devices.

As further shown in FIGS. 1D, 2C and 3K, the semiconductor device may include a source region 131, 331 of a second conductivity type, and a body region 132, 332 of a first conductivity type. The superjunction semiconductor device structure comprises a compensation region 133, 233, 333 of the second doping type in ohmic contact with the body region 132, 232, 332. The compensation region 133, 233, 333 extends deeper into the epitaxial layer 120, 220, 320 than the body region 132, 232, 332.

According to an embodiment, the semiconductor substrate 100, 200, 300 has a nitrogen concentration of less than $5\times10^{14}$ cm$^{-3}$. Providing the semiconductor substrate with such a low nitrogen concentration enables a lower density of deep-level defects. Nitrogen has a deep level within the band gap of silicon resulting in detrimental effects like e.g. enhanced leakage currents. Providing the semiconductor substrate with a low nitrogen concentration reduces the compensation effects of nitrogen on other dopants.

With the above range of variations of embodiments in mind, it should be understood that the present invention is not limited by the foregoing description nor is it intended to be limited by the accompanying drawings. Instead, the present invention is limited only by the following claims and their legal equivalents.

What is claimed is:

1. A method for manufacturing semiconductor devices, the method comprising:
   providing a semiconductor substrate having a surface region at a first side of the semiconductor substrate, the surface region having an initial surface oxygen concentration of less than $6\times10^{17}$ cm$^{-3}$;
   forming an epitaxial layer on the first side of the semiconductor substrate; and
   forming a plurality of superjunction semiconductor device structures in the epitaxial layer,
   wherein the semiconductor substrate has an initial oxygen bulk concentration of at least $6\times10^{17}$ cm$^{-3}$, the method further comprising:
   prior to forming the epitaxial layer, subjecting the semiconductor substrate to a thermal oxygen-out-diffusion anneal in an ambient containing one or more of oxygen, argon, hydrogen and nitrogen at a temperature sufficient to reduce the oxygen concentration at least in the surface region of the semiconductor substrate, to reduce the mean oxygen concentration below $6\times10^{17}$ cm$^{-3}$ in the surface region,
   wherein the surface region extends from the first side to a depth in the semiconductor substrate of at least 10 μm.

2. The method of claim 1, further comprising:
   subjecting the semiconductor substrate to a thermal oxidation anneal.

3. The method of claim 2, wherein the thermal oxidation anneal is carried out in an ambient containing water-vapour at a temperature between about 1000° C. and about 1300° C.

4. The method of claim 2, wherein the thermal oxidation anneal is at a temperature between about 1050° C. and about 1200° C.

5. The method of claim 2, further comprising:
   removing an oxide layer formed during the thermal oxidation anneal on the first side of the semiconductor substrate prior to forming the epitaxial layer.

6. The method of claim 1, wherein the thermal oxygen-out-diffusion anneal reduces the mean oxygen concentration below $5\times10^{17}$ cm$^{-3}$ in the surface region.

7. The method of claim 1, wherein the surface region extends from the first side to a depth in the semiconductor substrate of at least 20 μm.

8. The method of claim 1, wherein the plurality of superjunction semiconductor device structures is arranged at a pitch of 15 μm or less.

9. The method of claim 1, further comprising:
   forming a plurality of epitaxial sublayers on the first side of the semiconductor substrate;
   forming respective first doping regions of a first conductivity type in each of the epitaxial sublayers;
   forming respective second doping regions of a second conductivity type in each of the epitaxial sublayers;

forming a top epitaxial sublayer on the plurality of epitaxial sublayers, wherein the plurality of epitaxial sublayers and the top epitaxial sublayer together form the epitaxial layer;

subjecting the first and second doping regions to a drive-in process to form compensation regions of the superjunction semiconductor device structures; and forming a plurality of source regions of the second conductivity type and a plurality of body regions of the first conductivity type at least in the top epitaxial sublayer, wherein a respective one of the compensation regions is in ohmic contact with a respective one of the body regions.

10. The method of claim 1, further comprising:

forming a plurality of epitaxial sublayers of a second conductivity type on the first side of the semiconductor substrate;

forming respective first doping regions of a first conductivity type in each of the epitaxial sublayers;

forming a top epitaxial sublayer on the plurality of epitaxial sublayers, wherein the plurality of epitaxial sublayers and the top epitaxial sublayer together form the epitaxial layer;

subjecting the doping regions to a drive-in process to form compensation regions of the superjunction semiconductor device structures; and forming a plurality of source regions of the second conductivity type and a plurality of body regions of the first conductivity type at least in the top epitaxial sublayer, wherein a respective one of the compensation regions is in ohmic contact with a respective one of the body regions.

11. The method of claim 10, wherein the first doping regions has a lower doping concentration than the body regions.

12. The method of claim 1, wherein the semiconductor substrate has a nitrogen concentration of less than $5\times10^{14}$ cm$^{-3}$.

13. A method for manufacturing semiconductor devices, the method comprising:

providing a semiconductor substrate having an initial oxygen concentration of at least $6\times10^{17}$ cm$^{-3}$;

forming an epitaxial layer on a first side of the semiconductor substrate;

implanting dopants for forming a superjunction semiconductor device structure in the epitaxial layer; and subsequently to implanting, subjecting the epitaxial layer to a thermal treatment at a temperature of at least 1050° C. to diffuse the dopants in the epitaxial layer.

14. The method of claim 13, wherein forming the epitaxial layer comprises:

forming a plurality of epitaxial sublayers of a second conductivity type on the first side of the semiconductor substrate;

forming respective first doping regions of a first conductivity type in each of the epitaxial sublayers;

forming a top epitaxial sublayer on the plurality of epitaxial sublayers, wherein the plurality of epitaxial sublayers and the top epitaxial sublayer are part of the epitaxial layer;

subjecting the first doping regions to the thermal treatment to form compensation regions of the superjunction semiconductor device structures; and forming a plurality of source regions of the second conductivity type and a plurality of body regions of the first conductivity type at least in the top epitaxial sublayer, wherein a respective one of the compensation regions is in ohmic contact with a respective one of the body regions.

15. The method of claim 13, wherein the thermal treatment is at a temperature of at least 1150° C.

16. The method of claim 13, further comprising:

forming a protective oxide layer at least on the first side of the epitaxial layer prior to the thermal treatment.

17. The method of claim 13, further comprising:

prior to forming the epitaxial layer, subjecting the semiconductor substrate to:

a thermal oxygen-out-diffusion anneal in an ambient containing one or more of oxygen, argon, hydrogen and nitrogen at a temperature sufficient to reduce the oxygen concentration in a surface region of the semiconductor substrate; and/or a thermal oxidation anneal in an ambient containing water-vapour at a temperature between about 1000° C. and about 1300° C.

18. The method of claim 13, wherein the semiconductor substrate has a nitrogen concentration of less than $5\times10^{14}$ cm$^{-3}$.

19. The method of claim 13, wherein the plurality of superjunction semiconductor device structures are formed such that a pitch between adjacent superjunction semiconductor device structures is 15 μm or less.

20. A method for manufacturing semiconductor devices, the method comprising:

providing a semiconductor substrate having a surface region at a first side of the semiconductor substrate, the surface region having an initial surface oxygen concentration of less than $6\times10^{17}$ cm$^{-3}$;

forming an epitaxial layer on the first side of the semiconductor substrate;

forming a plurality of superjunction semiconductor device structures in the epitaxial layer;

forming a plurality of epitaxial sublayers on the first side of the semiconductor substrate;

forming respective first doping regions of a first conductivity type in each of the epitaxial sublayers;

forming respective second doping regions of a second conductivity type in each of the epitaxial sublayers;

forming a top epitaxial sublayer on the plurality of epitaxial sublayers, wherein the plurality of epitaxial sublayers and the top epitaxial sublayer together form the epitaxial layer;

subjecting the first and second doping regions to a drive-in process to form compensation regions of the superjunction semiconductor device structures; and forming a plurality of source regions of the second conductivity type and a plurality of body regions of the first conductivity type at least in the top epitaxial sublayer, wherein a respective one of the compensation regions is in ohmic contact with a respective one of the body regions.

21. A method for manufacturing semiconductor devices, the method comprising:

providing a semiconductor substrate having a surface region at a first side of the semiconductor substrate, the surface region having an initial surface oxygen concentration of less than $6\times10^{17}$ cm$^{-3}$;

forming an epitaxial layer on the first side of the semiconductor substrate;

forming a plurality of superjunction semiconductor device structures in the epitaxial layer;

forming a plurality of epitaxial sublayers of a second conductivity type on the first side of the semiconductor substrate;

forming respective first doping regions of a first conductivity type in each of the epitaxial sublayers;

forming a top epitaxial sublayer on the plurality of epitaxial sublayers, wherein the plurality of epitaxial sublayers and the top epitaxial sublayer together form the epitaxial layer;

subjecting the doping regions to a drive-in process to form compensation regions of the superjunction semiconductor device structures; and forming a plurality of source regions of the second conductivity type and a plurality of body regions of the first conductivity type at least in the top epitaxial sublayer, wherein a respective one of the compensation regions is in ohmic contact with a respective one of the body regions.

22. The method of claim 21, wherein the first doping regions has a lower doping concentration than the body regions.

23. A method for manufacturing semiconductor devices, the method comprising:

providing a semiconductor substrate having a surface region at a first side of the semiconductor substrate, the surface region having an initial surface oxygen concentration of less than $6 \times 10^{17}$ cm$^{-3}$;

forming an epitaxial layer on the first side of the semiconductor substrate;

forming a plurality of superjunction semiconductor device structures in the epitaxial layer; and subjecting the semiconductor substrate to a thermal oxidation anneal, wherein the thermal oxidation anneal is carried out in an ambient containing water-vapour at a temperature between about 1000° C. and about 1300° C., or the thermal oxidation anneal is at a temperature between about 1050° C. and about 1200° C.

24. A method for manufacturing semiconductor devices, the method comprising:

providing a semiconductor substrate having a surface region at a first side of the semiconductor substrate, the surface region having an initial surface oxygen concentration of less than $6 \times 10^{17}$ cm$^{-3}$;

forming an epitaxial layer on the first side of the semiconductor substrate;

forming a plurality of superjunction semiconductor device structures in the epitaxial layer;

subjecting the semiconductor substrate to a thermal oxidation anneal; and removing an oxide layer formed during the thermal oxidation anneal on the first side of the semiconductor substrate prior to forming the epitaxial layer.

25. A method for manufacturing semiconductor devices, the method comprising:

providing a semiconductor substrate having a surface region at a first side of the semiconductor substrate, the surface region having an initial surface oxygen concentration of less than $6 \times 10^{17}$ cm$^{-3}$;

forming an epitaxial layer on the first side of the semiconductor substrate; and forming a plurality of superjunction semiconductor device structures in the epitaxial layer, wherein the semiconductor substrate has a nitrogen concentration of less than $5 \times 10^{14}$ cm$^{-3}$.

* * * * *